(12) United States Patent
Pillarisetty et al.

(10) Patent No.: US 11,288,586 B2
(45) Date of Patent: Mar. 29, 2022

(54) INDEPENDENT DOUBLE-GATE QUANTUM DOT QUBITS

(71) Applicant: Intel Corporation, Santa Clara, CA (US)

(72) Inventors: Ravi Pillarisetty, Portland, OR (US); Hubert C. George, Portland, OR (US); Jeanette M. Roberts, North Plains, OR (US); Nicole K. Thomas, Portland, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/320,153

(22) PCT Filed: Sep. 27, 2016

(86) PCT No.: PCT/US2016/053861
§ 371 (c)(1),
(2) Date: Jan. 24, 2019

(87) PCT Pub. No.: WO2018/063138
PCT Pub. Date: Apr. 5, 2018

(65) Prior Publication Data
US 2019/0266511 A1    Aug. 29, 2019

(51) Int. Cl.
*H01L 29/423* (2006.01)
*G06N 10/00* (2022.01)
(Continued)

(52) U.S. Cl.
CPC ....... *G06N 10/00* (2019.01); *H01L 29/42356* (2013.01); *H01L 29/66* (2013.01);
(Continued)

(58) Field of Classification Search
None
See application file for complete search history.

(56) References Cited

U.S. PATENT DOCUMENTS 7,830,695 B1    11/2010    Moon
2002/0179897 A1    12/2002    Eriksson et al.
(Continued)

FOREIGN PATENT DOCUMENTS

WO    2017155531 A1    9/2017
WO    2017213638 A1    12/2017
(Continued)

OTHER PUBLICATIONS

"A Nanodamascene Process for Advanced Single-Electron Transistor Fabrication," Dubuc et al, IEEE Transactions on Nanotechnology, vol. 7, No. 1, Jan. 2008, pp. 68-73.
(Continued)

*Primary Examiner* — Jack S Chen
(74) *Attorney, Agent, or Firm* — Patent Capital Group

(57) ABSTRACT

Disclosed herein are quantum dot devices, as well as related computing devices and methods. For example, in some embodiments, a quantum dot device may include a base and a fin extending away from the base and including a quantum well layer. The device may further include a first gate disposed on a first side of the fin and a second gate disposed on a second side of the fin, different from the first side. Providing gates on different sides of a fin advantageously allows increasing the number of quantum dots which may be independently formed and manipulated in the fin. The quantum dots formed in such a device may be constrained in the x-direction by the one or more gates, in the y-direction by the fin, and in the z-direction by the quantum well layer, as discussed in detail herein. Methods for fabricating such devices are also disclosed.

14 Claims, 10 Drawing Sheets

(51) Int. Cl.
  *H01L 29/66* (2006.01)
  *H01L 29/78* (2006.01)
  *H01L 29/778* (2006.01)
(52) U.S. Cl.
  CPC ...... *H01L 29/66977* (2013.01); *H01L 29/785* (2013.01); *H01L 29/7781* (2013.01); *H01L 29/7783* (2013.01)

(56) References Cited

U.S. PATENT DOCUMENTS

| | | | |
|---|---|---|---|
| 2003/0111659 | A1 | 6/2003 | Tzalenchuk et al. |
| 2010/0006821 | A1 | 1/2010 | Choi et al. |
| 2011/0147711 | A1* | 6/2011 | Pillarisetty ............ H01L 29/775 257/24 |
| 2012/0074386 | A1 | 3/2012 | Rachmady et al. |
| 2013/0264617 | A1 | 10/2013 | Joshi et al. |
| 2015/0279981 | A1 | 10/2015 | Eriksson et al. |
| 2019/0131511 | A1 | 5/2019 | Clarke et al. |
| 2019/0140073 | A1 | 5/2019 | Pillarisetty et al. |
| 2019/0148530 | A1 | 5/2019 | Pillarisetty et al. |
| 2019/0157393 | A1 | 5/2019 | Roberts et al. |
| 2019/0164077 | A1 | 5/2019 | Roberts et al. |
| 2019/0165152 | A1 | 5/2019 | Roberts et al. |
| 2019/0181256 | A1 | 6/2019 | Roberts et al. |
| 2019/0206991 | A1 | 7/2019 | Pillarisetty et al. |
| 2019/0206992 | A1 | 7/2019 | George et al. |
| 2019/0206993 | A1 | 7/2019 | Pillarisetty et al. |
| 2019/0214385 | A1 | 7/2019 | Roberts et al. |
| 2019/0229188 | A1 | 7/2019 | Clarke et al. |
| 2019/0229189 | A1 | 7/2019 | Clarke et al. |
| 2019/0259850 | A1 | 8/2019 | Pillarisetty et al. |
| 2019/0267692 | A1 | 8/2019 | Roberts et al. |
| 2019/0288176 | A1 | 9/2019 | Yoscovits et al. |
| 2019/0296214 | A1 | 9/2019 | Yoscovits et al. |
| 2019/0305037 | A1 | 10/2019 | Michalak et al. |
| 2019/0305038 | A1 | 10/2019 | Michalak et al. |
| 2019/0312128 | A1 | 10/2019 | Roberts et al. |
| 2019/0341459 | A1 | 11/2019 | Pillarisetty et al. |
| 2019/0363181 | A1 | 11/2019 | Pillarisetty et al. |
| 2019/0363239 | A1 | 11/2019 | Yoscovits et al. |

FOREIGN PATENT DOCUMENTS

| | | |
|---|---|---|
| WO | 2017213639 A1 | 12/2017 |
| WO | 2017213641 A1 | 12/2017 |
| WO | 2017213645 A1 | 12/2017 |
| WO | 2017213646 A1 | 12/2017 |
| WO | 2017213647 A1 | 12/2017 |
| WO | 2017213648 A1 | 12/2017 |
| WO | 2017213649 A1 | 12/2017 |
| WO | 2017213651 A1 | 12/2017 |
| WO | 2017213661 A1 | 12/2017 |
| WO | 2017217958 A1 | 12/2017 |
| WO | 2018030977 A1 | 2/2018 |
| WO | 2018044267 A1 | 3/2018 |
| WO | 2018057013 A1 | 3/2018 |
| WO | 2018057015 A1 | 3/2018 |
| WO | 2018057018 A1 | 3/2018 |
| WO | 2018057023 A1 | 3/2018 |
| WO | 2018057024 A1 | 3/2018 |
| WO | 2018057027 A1 | 3/2018 |
| WO | 2018063138 | 4/2018 |

OTHER PUBLICATIONS

"A two-qubit logic gate in silicon," Veldhorst et al., Nature, vol. 526, Oct. 15, 2015, pp. 410-414.
"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.
"Fast sensing of double-dot charge arrangement and spin state with an rf sensor quantum dot," Barthel et al, Materials Department, University of California, Santa Barbara, Jan. 16, 2014, 4 pages.
"Undoped accumulation-mode Si/SiGe quantum dots," Borselli et al, HRL Laboratories, LLC., Jul. 15, 2014, 4 pages.
"Spin Relaxation and Decoherence of Holes in Quantum Dots," Bulaev et al., Phys. Rev. Lett. 95, 076805, Aug. 11, 2005, 1 page.
"Fundamentals of Silicon Material Properties for Successful Exploitation of Strain Engineering in Modern CMOS Manufacturing," Chidambaram et al, IEE Transactions on Electron Devices, vol. 53, No. 5, May 2006, pp. 944-964.
"Ultrafast optical control of individual quantum dot spin qubits," De Greve et al, Reports on Progress in Physics, vol. 76, No. 9, Sep. 4, 2013, 2 pages.
"Fabrication and Characterization of Sidewall Defined Silicon-on-Insulator Single-Electron Transistor," Jung et al., IEEE Transactions on Nanotechnology, vol. 7, No. 5, Sep. 2008, pp. 544-550.
"How it's built: Micron/Intel3D NAND Micron Opens the Veil a Little," Moyer, Bryon, retrieved from https://www.eejournal.com/article/20160201-micron/ on Nov. 29, 2017, 9 pages.
"Investigation of Vertical Type Single-Electron Transistor with Sidewall Spacer Quantum Dot," Kim et al, Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDR2011, 2 pages.
"Platinum single-electron transistors with tunnel barriers made by atomic layer deposition", George et al., Department of Electrical Engineering, University of Notre Dame, Published Nov. 5, 2010, 3 pages.
"Quantum computation with quantum dots," Loss et al , Physical Review A, vol. 57, No. 1, Jan. 1998, pp. 120-126.
"Ultafast high-fidelity initialization of a quantum-dot spin qubit without magnetic fields," Mar et al., Phys. Rev. B 90 241303®, published Dec. 15, 2014, 1 page.
"Delaying Forever: Uniaxial Strained Silicon Transistors in a 90nm CMOS Technology," Mistry et al Portland Technology Department, TCAD, Intel Corp., 2 pages.
Supplementary Information, retrieved from www.nature.com, doi:10. 1038/nature 15263, 8 pages.
"Embracing the quantum limit in silicon computing," Morton et al, Macmillan Publishers, Nov. 17, 2011, vol. 479, Nature, pp. 345-353.
"Review : Towards Spintronic Quantum Technologies with Dopants in Silicon," Morley, Gavin, Department of Physics, University of Warwich, 13 pages.
"A Reconfigurable Gate Architecture for Si/SiGe Quantum Dots," Zajac et al., Department of Physics, Princeton University; Department of Physics, University of California; Feb. 6, 2015, 5 pages.
"Defect reduction of selective Ge epitaxy in trenches on Si(001) substrates using aspect ratio trapping," Park et al., Applied Physics Letter 90, 052113 (2007), pp. 052113-1 through 3.
"Photon- and phonon-assisted tunneling in the three-dimensional charge stability diagram of a triple quantum dot array," Braakman et al., Applied Physics Letters 102, 112110 (2013), pp. 112110-1 through 4 (5 pages with cover sheet).
"Radio frequency measurements of tunnel couplings and singlet-triplet spin states in Si:P quantum dots," House et al., Nature Communications, 6:884, DOI: 10.1038/ncomms9848, pp. 1-6.
"Detecting bit-flip errors in a logical qubit using stabilizer measurements," Riste et al., Nature Communications, 6:6983, DOI: 10.1038/ncomms7983, pp. 1-6.
"Scalable gate architecture for densely packed semiconductor spin qubits," Zajac et al, Department of Physics, Princeton University; Sandia National Laboratories, 8 pages.
"Silicon CMOS architecture for a spin-based quantum computer," Veldhorst et al., Qutech, TU Delft, The Netherlands, Centre for Quantum Computation and Communication Technology, School of Electrical Engineering and Telecommunications, The University of New South Wales, NanoElectronics Group, MESA + Institute for Nanotechnology, University of Twente, The Netherlands, Oct. 2, 2016, 13 pages.

(56) References Cited

OTHER PUBLICATIONS

"Single-electron Transistors fabricated with sidewall spacer patterning," Park et al., Superlattices and Microstructures 34 (2003) 231-239.
"Single-electron Transistors with wide operating temperature range," Dubuc et al., Applied Physics Letters 90, 113104 (2007) pp. 113104-1 through 3.
"Single-shot read-out of an individual electron spin in a quantum dot," Elzerman et al., Nature, vol. 430, Jul. 22, 2004, pp. 431-435.
"An addressable quantum dot qubit with fault-tolerant control-fidelity," Veldhorst et al., Nature Nanotechnology vol. 9, Dec. 2014, pp. 981-985.
International Search Report and Written Opinion issued in PCT/US2016/053861 dated Jun. 7, 2017; 13 pages.

\* cited by examiner

INDEPENDENT DOUBLE-GATE QUANTUM DOT QUBITS

CROSS-REFERENCE TO RELATED APPLICATION

This application is a national stage application under 35 U.S.C. § 371 of PCT International Application Serial No. PCT/US2016/053861, filed on Sep. 27, 2016 and entitled "INDEPENDENT DOUBLE-GATE QUANTUM DOT QUBITS," which is hereby incorporated by reference herein in its entirety.

TECHNICAL FIELD

This disclosure relates generally to the field of quantum computing, and more specifically, to quantum dot qubits.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION

Overview

Figure 1:
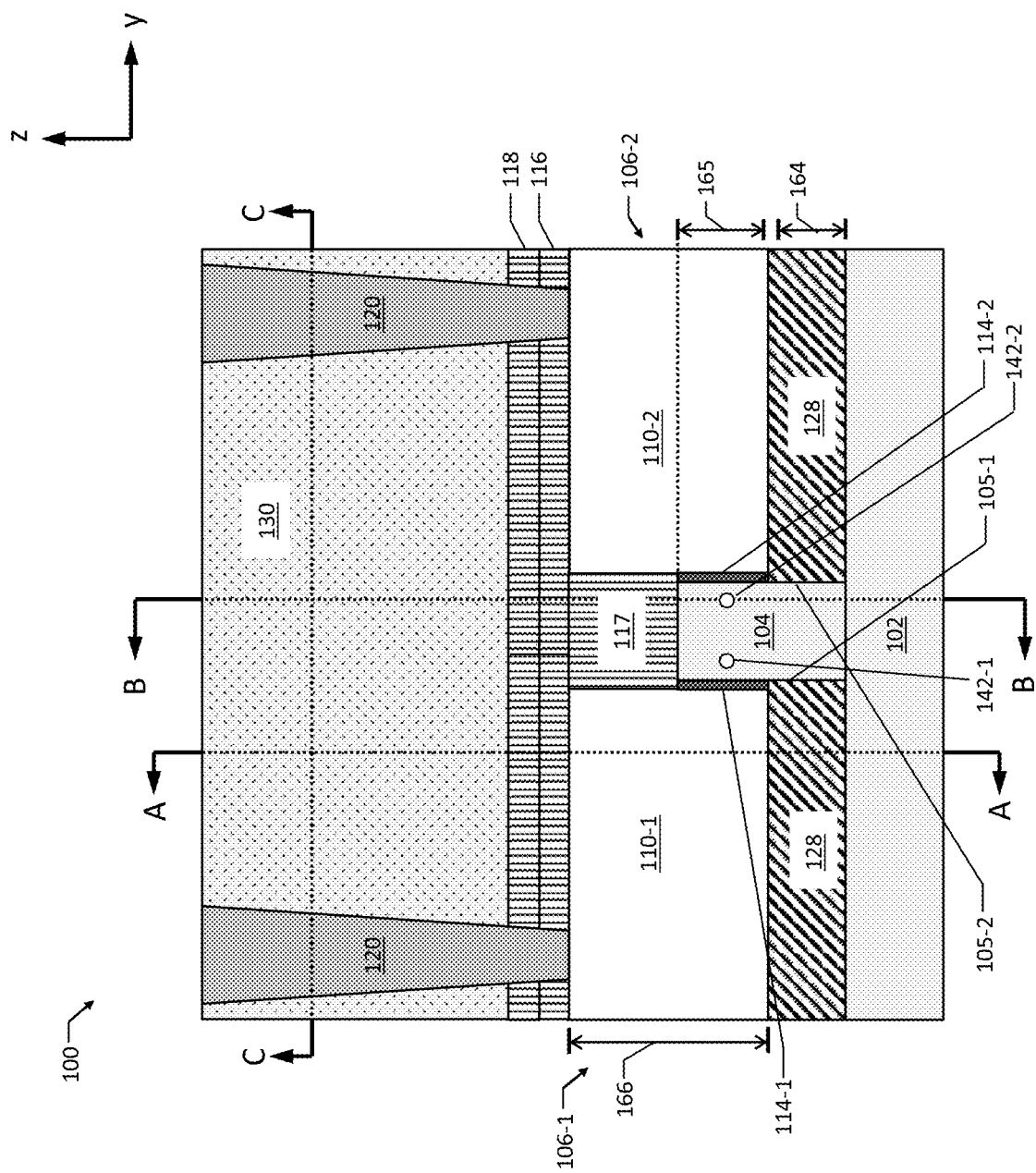
FIGS. 1-4 are cross-sectional views of a quantum dot device, in accordance with various embodiments.

As previously described herein, quantum computing, or quantum information processing, refers to the field of research related to computation systems that use quantum-mechanical phenomena to manipulate data. One example of quantum-mechanical phenomena is the principle of quantum superposition, which asserts that any two or more quantum states can be added together, i.e. superposed, to produce another valid quantum state, and that any quantum state can be represented as a sum of two or more other distinct states. Quantum entanglement is another example of quantum-mechanical phenomena. Entanglement refers to groups of particles being generated or interacting in such a way that the state of one particle becomes intertwined with that of the others. Furthermore, the quantum state of each particle cannot be described independently. Instead, the quantum state is given for the group of entangled particles as a whole. Yet another example of quantum-mechanical phenomena is sometimes described as a "collapse" because it asserts that when we observe (measure) particles, we unavoidably change their properties in that, once observed, the particles cease to be in a state of superposition or entanglement (i.e. by trying to ascertain anything about the particles, we collapse their state).

Put simply, superposition postulates that a given particle can be simultaneously in two states, entanglement postulates that two particles can be related in that they are able to instantly coordinate their states irrespective of the distance between them in space and time, and collapse postulates that when one observes a particle, one unavoidably changes the state of the particle and its' entanglement with other particles. These unique phenomena make manipulation of data in quantum computers significantly different from that of classical computers (i.e. computers that use phenomena of classical physics). Classical computers encode data into binary values, commonly referred to as bits. At any given time, a bit is always in only one of two states—it is either 0 or 1. Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled.

Compared to well-established and thoroughly researched classical computers, quantum computing is still in its infancy, with the highest number of qubits in a solid-state quantum processor currently being about 10. One of the main challenges resides in protecting qubits from decoherence so that they can stay in their information-holding states long enough to perform the necessary calculations and read out the results. Another challenge that is drastically different from classical computing is that qubits are typically operated at cryogenic temperatures, just a few degrees or even a few millidegrees above absolute zero, because cryogenic temperatures are thought to help minimize qubit decoherence.

These challenges explain why so many current efforts of the industry and the academics continue to focus on a search for new and improved physical systems whose functionality could approach that expected of theoretically designed qubits. Physical systems for implementing qubits that have been explored until now include e.g. quantum dot qubits, superconducting qubits, single trapped ion qubits, photon polarization qubits, etc.

Out of the various physical implementations of qubits listed above, quantum dot qubits are promising candidates for building a quantum computer.

Disclosed herein are quantum dot devices, as well as related computing devices and methods. For example, in some embodiments, a quantum dot device may include a base and a fin extending away from the base and including a quantum well layer. The device may further include a first gate disposed on a first side of the fin and a second gate disposed on a second side of the fin, different from the first side. The quantum dots formed in such a device may be constrained in the x-direction by the one or more gates, in the y-direction by the fin, and in the z-direction by the quantum well layer, as discussed in detail herein. Methods for fabricating such devices are also disclosed.

The quantum dot devices disclosed herein may enable the formation of quantum dots to serve as quantum bits ("qubits") in a quantum computing device, as well as the control of these quantum dots to perform quantum logic operations. Unlike previous approaches to quantum dot formation and manipulation, various embodiments of the quantum dot devices disclosed herein provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices. In addition, providing gates on different sides of a fin advantageously allows increasing the number of quantum dots which may be independently formed and manipulated in a single fin.

For the purposes of the present disclosure, the terms "side," "top," and "bottom" as used herein refer to a relative position of one face of a three-dimensional object or a structure with respect to other faces of that object or structure and with respect to a certain reference point. For example, if a reference point is a substrate on which a quantum dot device is provided, or a base of a quantum dot device, then the face of a fin that is provided on the base (i.e. the face of the fin that is closest to the substrate of all other faces), may be referred to as a bottom of the fin. On the other hand, a "side" of a fin refers to each of the faces of the fin which share an edge with the bottom of the fin (i.e. sides are faces which are adjacent to the bottom). A "top" of a fin refers to a face of the fin which is neither the bottom nor any of the sides. The terms "faces" and "edges" are used herein in their conventional manner as used in geometry, where a face is any of the individual surfaces of a solid three-dimensional object and an edge is a line segment where faces meet.

Further, the terms such as "upper," "lower," "over," "under," "between," and "on" as used herein also refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

The phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale.

As used herein, terms indicating what may be considered an idealized behavior, such as e.g. "superconducting" or "lossless", are intended to cover functionality that may not be exactly ideal but is within acceptable margins for a given application. For example, a certain level of loss, either in terms of non-zero electrical resistance or non-zero amount of spurious two-level systems (TLS's) may be acceptable such that the resulting materials and structures may still be referred to by these "idealized" terms. Specific values associated with an acceptable level of loss are expected to change over time as fabrication precision will improve and as fault-tolerant schemes may become more tolerant of higher losses, all of which are within the scope of the present disclosure.

As used herein, a "high-k dielectric" refers to a material having a higher dielectric constant than silicon oxide.

Furthermore, while the present disclosure may include references to microwave signals, this is done only because current qubits are designed to work with such signals because the energy in the microwave range is higher than thermal excitations at the temperature that qubits are operated at. In addition, techniques for the control and measurement of microwaves are well known. For these reasons, typical frequencies of qubits are in 5-10 gigahertz (GHz) range, in order to be higher than thermal excitations, but low enough for ease of microwave engineering. However, advantageously, because excitation energy of qubits is controlled by the circuit elements, qubits can be designed to have any frequency. Therefore, in general, qubits could be designed to operate with signals in other ranges of electromagnetic spectrum and embodiments of the present disclosure could be modified accordingly. All of these alternative implementations are within the scope of the present disclosure.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Furthermore, in the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations need not be performed in the order of presentation. Operations described may be performed in a different order from the described embodiment(s). Various additional operations may be performed, and/or described operations may be omitted in additional embodiments.

Exemplary Embodiments of Quantum Dot Qubits with Independent Double-Gates

Figure 2:
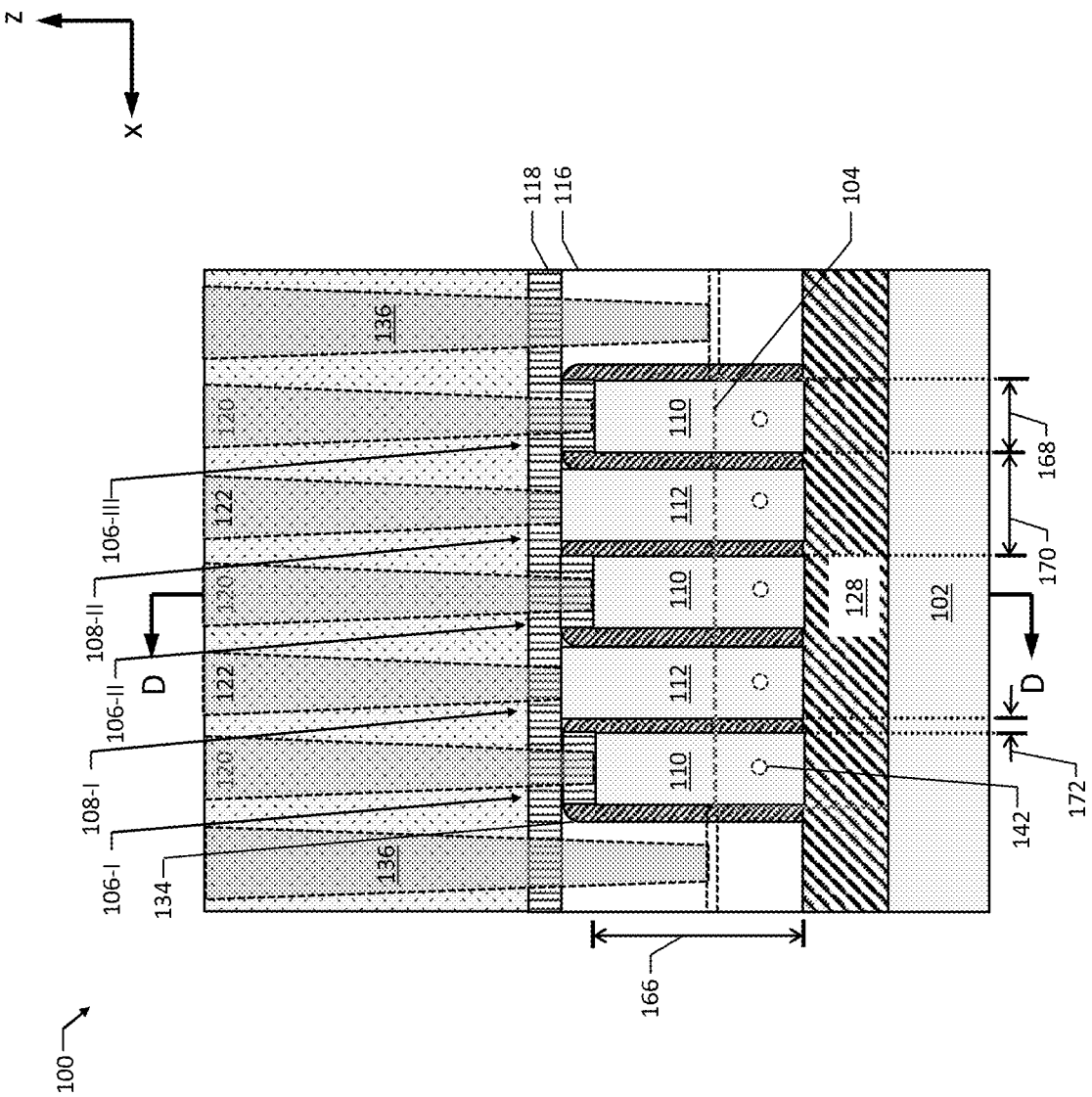
Figure 3:
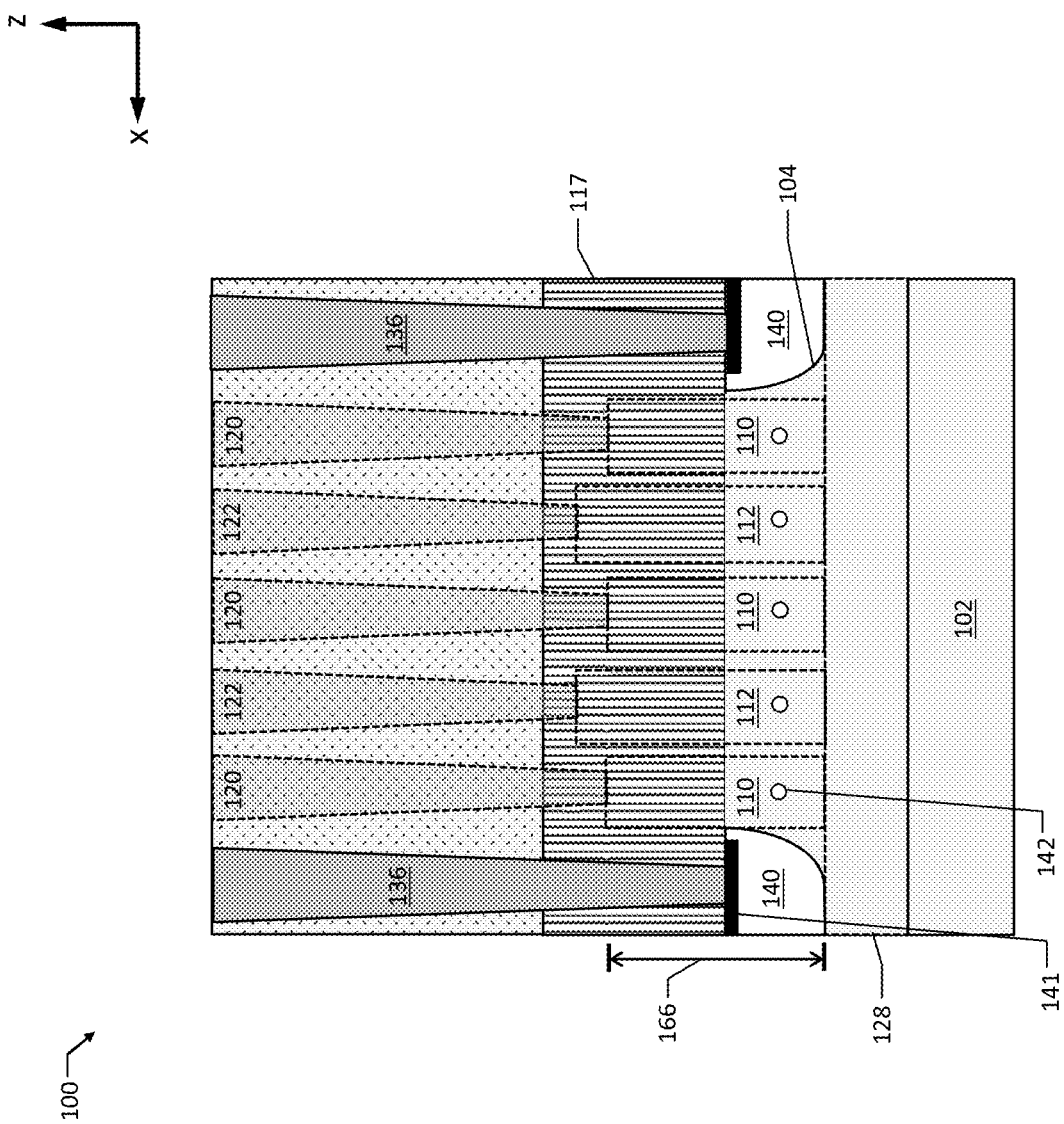
Figure 4:
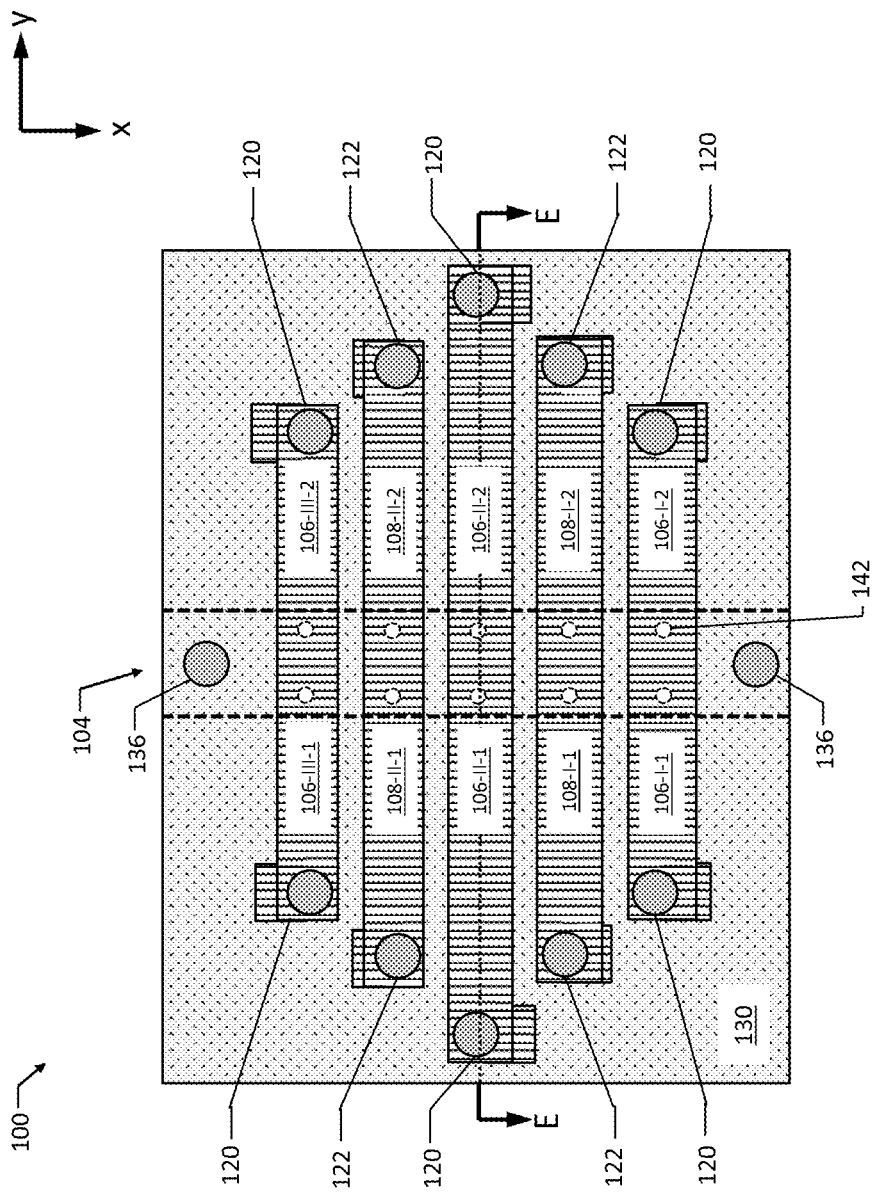

FIGS. 1-4 are cross-sectional views of an exemplary quantum dot device 100 implementing quantum dot qubits, in accordance with various embodiments. In particular, FIG. 2 illustrates the quantum dot device 100 taken along the section A-A of FIG. 1 (while FIG. 1 illustrates the quantum dot device 100 taken along the section D-D of FIG. 2), FIG. 3 illustrates the quantum dot device 100 taken along the section B-B of FIG. 1, and FIG. 4 illustrates the quantum dot device 100 taken along the section C-C of FIG. 1 (while FIG. 1 illustrates a quantum dot device 100 taken along the section E-E of FIG. 4). Although FIG. 1 indicates that the cross-section illustrated in FIG. 2 is taken through the gate metal 110-1 of the first gate 106-1 of a pair of gates 106 (i.e. gates 106-1 and 106-2), an analogous cross section taken through the gate metal 110-2 of the second gate 106-2 of the pair may be identical, and thus the discussion of FIGS. 1-4 may refer generally to the "gate metal 110" or/and "gate 106." In FIGS. 1-4, solid lines are intended to represent objects in view of the plane of the figure, while dotted lines are intended to represent objects out of the plane of the figure (either in a plane in front of the plane of the figure or in a plane behind the plane of the figure).

The quantum dot device 100 may include a base 102 and multiple fin 104 extending away from the base 102. The base 102 and the fin 104 may include a semiconductor substrate and a quantum well stack (not shown in FIGS. 1-4, but discussed below with reference to the semiconductor substrate 144 and the quantum well stack 146), distributed in any of a number of ways between the base 102 and the fin 104. The base 102 may include at least some of the semiconductor substrate, and the fin 104 may each include a quantum well layer of the quantum well stack (discussed below with reference to the quantum well layer 152). Examples of base/fin arrangements are discussed below with reference to the base fin arrangements 158 of FIGS. 15-21.

Although only one fin 104 is shown in FIGS. 1-4, this is simply for ease of illustration, and more than one fin 104 may be included in the quantum dot device 100. When the quantum dot device 100 includes more than two fins 104, the fins 104 may be arranged in pairs in a line (e.g., 2N fins total may be arranged in a 1×2N line, or a 2×N line) or in pairs in a larger array (e.g., 2N fins total may be arranged as a 4×N/2 array, a 6×N/3 array, etc.). The discussion herein will largely focus on a single fin 104 for ease of illustration, but all the teachings of the present disclosure apply to quantum dot devices 100 with more fins 104.

As noted above, the fin 104 may include a quantum well layer (not shown in FIGS. 1-4, but discussed below with reference to the quantum well layer 152). The quantum well layer included in the fin 104 may be arranged normal to the z-direction, and may provide a layer in which a two-dimensional electron gas (2DEG) may form to enable the generation of a quantum dot during operation of the quantum dot device 100, as discussed in further detail below. The quantum well layer itself may provide a geometric constraint on the z-location of quantum dots in the fin 104, and the limited extent of the fin 104 (and therefore the quantum well layer) in the y-direction may provide a geometric constraint on the y-location of quantum dots in the fin 104. To control the x-location of quantum dots in the fin 104, voltages may be applied to gates disposed on the sides of the fin 104 to adjust the energy profile along the fin 104 in the x-direction and thereby constrain the x-location of quantum dots within quantum wells (discussed in detail below with reference to the gates 106/108). In addition, voltages applied to gates disposed on the sides of the fin 104 adjust the energy profile within the fin 104 in the y-direction and thereby further define the y-location of quantum dots within quantum wells. The dimensions of the fin 104 may take any suitable values. For example, in some embodiments, the fin 104 may have a width 162 between 10 and 40 nanometers, e.g. between 20 and 40 nanometers or between 10 and 30 nanometers. In some embodiments, the fin 104 may have a height 164 between 200 and 400 nanometers (e.g., between 250 and 350 nanometers, or equal to 300 nanometers).

An insulating material 128 may be disposed on portions of the opposite faces 105 of the fin 104. Faces 105 are sides of the fin 104, shown in FIG. 1 as a first side 105-1 and a second side 105-2, while the bottom of the fin 104 is shown in FIG. 1 as a bottom 103. The insulating material 128 may be a dielectric material, such as silicon oxide, e.g. any material used as a shallow trench isolator (STI). The insulating material 128 may be used to space multiple fins 104 apart from one another. For example, in some embodiments, multiple fins 104 may be spaced apart by a distance 160 between 100 and 250 microns. Such multiple fins may be arranged in parallel in the x-z plane indicated in FIGS. 1-4.

While portions of the sides 105 of the fin 105 may be covered with the insulating material 128, on the remaining portions of the sides 105 (i.e. portions not covered with the insulating material 128), at least two gates may be disposed. This is illustrated in FIG. 1 with a first gate 106-1 being provided on the first side 105-1 and a second gate 106-2 being provided on the second side 105-2. Two gates disposed on the opposite side of the fin and facing one another are referred to herein as a "set/pair of gates" or "double-gates." As used herein, "a gate being disposed on a side of a fin" refers to at least a portion of a gate metal of the gate being disposed on a side of a fin, with the gate dielectric 114 in between. Since a hardmask 117 is provided on top of the fin 104, as described in greater detail below and as shown in FIG. 1, another portion of the gate metal of the gate may be adjacent to the hardmask 117. A portion of the side 105 on which the gate is disposed may be between 50 and 100 nanometers, e.g. between 20 and 50 nanometers, measured along a direction in which the fin 104 extends away from the base 102 (for the illustration in FIG. 1, in the z-direction, as shown with a dimension 165).

In some embodiments, multiple pairs of gates such as a pair of gates 106-1 and 106-2 may be disposed on the sides 105. In the embodiment illustrated in FIG. 2, three pairs of gates 106 (indicated as a pair 106-I, a pair 106-II, and a pair 106-III) and two pairs of gates 108 (indicated as a pair 108-I and a pair 108-II) are shown as distributed on the sides of the fin 104. This particular number of pairs of gates is simply illustrative, and any suitable number of pairs of gates provided on the sides of the fin 104 may be used.

Although the notation "-1" is dropped in FIG. 2, this FIG. illustrates the gate metal 110-1 of the first gate of each pair of gates. For example, the pair of gates 106-II shown in FIG. 2 includes the gate metal as "110" referring to the gate metal 110-1 on the first side of the fin 104 shown in FIG. 1. The gate metal 110-2 provided on the opposite side 105-2 is right behind the gate metal 110-1 in the view of FIG. 2 (behind the plane of FIG. 2). As shown in FIG. 2, the pair of gates 108-I may be disposed between the pairs of gates 106-I and 106-II, and the pair of gates 108-II may be disposed between the pairs of gates 106-II and 106-III. Each of the pairs of gates 106/108 may include a gate dielectric 114 on each gate of a pair, shown in the embodiment illustrated in FIG. 1 as a gate dielectric 114-1 for the first gate 110-1 and a gate dielectric 114-2 for the second gate 110-2. The same applies to all other pairs of the gates 106/108. In some embodiments, the gate dielectric 114 may also be provided between the gate metal 110/112 and the insulating material 128 (now shown in FIG. 1). In some embodiments, the gate dielectric 114 may be a multilayer gate dielectric (e.g., with multiple materials used to improve the interface between the fin 104 and the corresponding gate metal). The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114.

Each of the pairs of gates 106 may include a gate metal 110 in each gate of the pair (shown in FIG. 1 as a gate metal 110-1 of the first gate of the pair of gates 106 and a gate metal 110-2 of the second gate of that pair of gates), and a hardmask 116 for each gate of the pair. The hardmask 116 may be formed of silicon nitride, silicon carbide, or another suitable material. For each gate of a pair of gates, the gate metal 110 may be disposed between the hardmask 116 and the insulating material 128, and the gate dielectric 114 may be disposed between the gate metal 110 and the fin 104. Only one portion of the hardmask 116 is labeled in FIG. 2 for ease of illustration. In some embodiments, the gate metal 110 may be a superconductor, such as aluminum, molybdenum rhenium, titanium nitride, niobium nitride, or niobium titanium nitride, e.g. deposited via atomic layer deposition. In some embodiments, the hardmask 116 may not be present in the quantum dot device 100 (e.g., a hardmask like the hardmask 116 may be removed during processing). The sides of the gate metal 110 may be substantially parallel, as shown in FIG. 2, and insulating spacers 134 may be disposed on the sides of the gate metal 110 and the hardmask 116. As illustrated in FIG. 2, the spacers 134 may be thicker closer to the fin 104 and thinner farther away from the fin 104. In some embodiments, the spacers 134 may have a convex shape. The spacers 134 may be formed of any suitable material, such as a carbon-doped oxide, silicon nitride, silicon oxide, or other carbides or nitrides (e.g., silicon carbide, silicon nitride doped with carbon, and silicon oxynitride).

Each of the pairs of gates 108 may include a gate metal 112 in each gate of the pair and a hardmask 118 for each gate of the pair. The hardmask 118 may be formed of silicon nitride, silicon carbide, or another suitable material. For each gate of a pair of gates, the gate metal 112 may be disposed between the hardmask 118 and the insulating material 128, and the gate dielectric 114 may be disposed between the gate metal 112 and the fin 104. In the embodiment illustrated in FIG. 2, the hardmask 118 may extend over the hardmask 116 (and over the gate metal 110 of the corresponding gates of the pairs of gates 106), while in other embodiments, the hardmask 118 may not extend over the gate metal 110. In some embodiments, the gate metal 112 may be a different metal from the gate metal 110; in other embodiments, the gate metal 112 and the gate metal 110 may have the same material composition. In some embodiments, the gate metal 112 may be a superconductor, such as aluminum, molybdenum rhenium, titanium nitride, niobium nitride, or niobium titanium nitride, e.g. deposited via atomic layer deposition. In some embodiments, the hardmask 118 may not be present in the quantum dot device 100 (e.g., a hardmask like the hardmask 118 may be removed during processing).

Each gate in the pair of gates 108 may extend between the corresponding proximate spacers 134 on the sides of the corresponding gate of the pair of the gates 106-I and the corresponding gate of the pair of the gates 106-III, as shown in FIG. 2. In some embodiments, the gate metal 112 may extend between the spacers 134 on the sides of the gate 106-I and the gate 106-III. Thus, the gate metal 112 may have a shape that is substantially complementary to the shape of the spacers 134, as shown.

Each of the pairs of gates may further include a hardmask 117 disposed over the portion of the fin 104 between the first gate and the first gate of the pair, as shown in FIG. 1. For each pair of gates, the hardmask 117 may be disposed between the first gate metal (e.g. 110-1) and the second gate metal (e.g. 110-2). Thus, the hardmask 117 separates the first gate from the second gate of each pair of gates on the sides of the fin 104. The hardmask 117 may be formed of silicon nitride, silicon carbide, or another suitable material. In the embodiment illustrated in FIG. 1, the hardmask 118 and/or the hardmask 116 may extend over the hardmask 117, while in other embodiments, the hardmask 118 and/or the hardmask 116 may not extend over the hardmask 117.

The dimensions of the gates 106/108 may take any suitable values. For example, in some embodiments, the z-height 166 of the gate metal 110 may be between 40 and 75 nanometers (e.g., approximately 50 nanometers); the z-height of the gate metal 112 may be in the same range. In embodiments like the ones illustrated in FIG. 2, the z-height of the gate metal 112 may be greater than the z-height of the gate metal 110. In some embodiments, the length 168 of the gate metal 110 (i.e., in the x-direction) may be between 20 and 40 nanometers (e.g., 30 nanometers). In some embodiments, the distance 170 between adjacent ones of the gates 106 (e.g., as measured from the gate metal 110 of one gate 106 to the gate metal 110 of an adjacent gate 106 in the x-direction, as illustrated in FIG. 2) may be between 40 and 60 nanometers (e.g., 50 nanometers). In some embodiments, the thickness 172 of the spacers 134 may be between 1 and 10 nanometers (e.g., between 3 and 5 nanometers, between 4 and 6 nanometers, or between 4 and 7 nanometers). The length of the gate metal 112 (i.e., in the x-direction) may depend on the dimensions of the gates 106 and the spacers 134, as illustrated in FIG. 2. As indicated in FIG. 1, the gates 106/108 on one fin 104 may extend over the insulating material 128 beyond their respective fin 104 and towards the other fin 104, but may be isolated from their counterpart gates by the intervening insulating material 130.

As shown in FIG. 2, the pairs of gates 106 and 108 may be alternatingly arranged along the fin 104 in the x-direction. During operation of the quantum dot device 100, voltages may be applied to the gates 106/108 to adjust the potential energy in the quantum well layer (not shown) in the fin 104 to create quantum wells of varying depths in which quantum dots 142 may form. Only one quantum dot 142 is labeled with a reference numeral in FIGS. 2-4 for ease of illustration, but two quantum dots 142-1 and 142-2 are indicated as solid line circles in the fin 104 in the view shown in FIG. 1 and five pairs of such quantum dots are indicated as a single circle for each pair of quantum dots in the fin 104 as shown in FIGS. 2-4, forming what may be referred to as a "quantum dot array." The location of the quantum dots 142 in FIGS. 1-4 is not intended to indicate a particular geometric positioning of the quantum dots 142. However, in all embodiments, by virtue of providing a pair of gates 106 or 108, with a gate on the opposite sides 105 of the fin 104, two quantum dots may be formed, independently from one another, in a single fin, as shown with a pair of quantum dots 142-1 and 142-2 in FIG. 1. When multiple pairs of gates 106/108 are provided, multiple pairs of quantum dots may be formed. For example, for five gate pairs with three pairs 106 and two pairs 108, as in the embodiment illustrated in FIGS. 2-4, ten quantum dots may be formed in the fin 104.

The spacers 134 may themselves provide "passive" barriers between quantum wells under the gates 106/108 in the quantum well layer, and the voltages applied to different ones of the gates 106/108 may adjust the potential energy under the gates 106/108 in the quantum well layer; decreasing the potential energy may form quantum wells, while increasing the potential energy may form quantum barriers.

The fin 104 may include doped regions 140 that may serve as a reservoir of charge carriers for the quantum dot device 100. For example, an n-type doped region 140 may supply electrons for electron-type quantum dots 142, and a p-type doped region 140 may supply holes for hole-type quantum dots 142. In some embodiments, an interface material 141 may be disposed at a surface of a doped region 140, as shown in FIG. 3. The interface material 141 may facilitate electrical coupling between a conductive contact (e.g., a conductive via 136, as discussed below) and the doped region 140. The interface material 141 may be any suitable material; for example, in embodiments in which the doped region 140 includes silicon, the interface material 141 may include nickel silicide.

The quantum dot devices 100 disclosed herein may be used to form electron-type or hole-type quantum dots 142. Note that the polarity of the voltages applied to the gates 106/108 to form quantum wells/barriers depend on the charge carriers used in the quantum dot device 100. In embodiments in which the charge carriers are electrons (and thus the quantum dots 142 are electron-type quantum dots), amply negative voltages applied to a gate 106/108 may increase the potential barrier adjacent to the gate 106/108, and amply positive voltages applied to a gate 106/108 may decrease the potential barrier adjacent to the gate 106/108 (thereby forming a potential well in which an electron-type quantum dot 142 may form). In embodiments in which the charge carriers are holes (and thus the quantum dots 142 are hole-type quantum dots), amply positive voltages applied to a gate 106/108 may increase the potential barrier adjacent to the gate 106/108, and amply negative voltages applied to a gate 106 and 108 may decrease the potential barrier adjacent to the gate 106/108 (thereby forming a potential well in which a hole-type quantum dot 142 may form). The quantum dot devices 100 disclosed herein may be used to form electron-type or hole-type quantum dots.

Voltages may be applied to each of the gates 106 and 108 separately to adjust the potential energy in the quantum well layer adjacent to the gates 106 and 108, and thereby control the formation of pairs of quantum dots 142 between each of the pair of gates 106 and 108. Additionally, the relative potential energy profiles under different first gates of the pairs of gates 106 and 108 allow the quantum dot device 100 to tune the potential interaction between the first row of quantum dots 142 under adjacent first gates. For example, if two adjacent quantum dots 142 (e.g., one quantum dot 142 adjacent to a first gate of the pair of gates 106 and another quantum dot 142 adjacent to a first gate of the pair of gates 108) are separated by only a short potential barrier, the two quantum dots 142 may interact more strongly than if they were separated by a taller potential barrier. Since the depth of the potential wells/height of the potential barriers adjacent to each gate of the pairs of gates 106/108 may be adjusted by adjusting the voltages on the respective gates of the pairs of gates 106/108, the differences in potential between adjacent gates of the pairs of gates 106/108 may be adjusted, and thus the interaction tuned.

In some applications, the pairs of gates 108 may be used as plunger gates to enable the formation of the pairs of quantum dots 142 between the first and second gates of the pairs of gates 108, while the pairs of gates 106 may be used as barrier gates to adjust the potential barrier between pairs quantum dots 142 formed between the first and second gates of the adjacent pairs of gates 108. In other applications, the pairs of gates 108 may be used as barrier gates, while the pairs of gates 106 are used as plunger gates. In other applications, pairs of quantum dots 142 may be formed between the first and second gates of all of the pairs of gates 106 and the pairs of gates 108, or adjacent to any desired subset of the pairs of gates 106 and 108.

In general, the term "plunger gate" is used to describe a gate adjacent to which an electro-static quantum dot is formed. By controlling the voltage applied to a plunger gate, it is possible to modulate the electric field adjacent to that gate to create an energy valley between the tunnel barriers created by the barrier gates. In general, the term "barrier gate" is used to describe a gate used to set a tunnel barrier (i.e. a potential barrier) between either two plunger gates (i.e. controlling tunneling of charge carrier(s), e.g. electrons, from one quantum dot to an adjacent quantum dot) or a plunger gate and an accumulation gate. Changing the voltage applied to a barrier gate changes the height of the tunnel barrier. When a barrier gate is used to set a tunnel barrier between two plunger gates, the barrier gate may be used to transfer charge carriers between quantum dots that may be formed adjacent to these plunger gates. When a barrier gate is used to set a tunnel barrier between a plunger gate and an accumulation gate, the barrier gate may be used to transfer charge carriers in and out of the quantum dot array via the accumulation gate. In general, the term "accumulation gate" is used to describe a gate used to form a 2DEG in an area that is between the area where the quantum dots may be formed and a charge carrier reservoir. Changing the voltage applied to the accumulation gate allows to control the number of charge carriers in the area adjacent to the accumulation gate. For example, changing the voltage applied to the accumulation gate allows reducing the number of charge carriers in the area adjacent to the gate so that single charge carriers can be transferred from the reservoir into the quantum dot array, and vice versa.

Conductive vias and lines may make contact with the gates 106/108, and to the doped regions 140, to enable electrical connection to the gates 106/108 and the doped regions 140 to be made in desired locations. As shown in FIGS. 1-4, the pairs of gates 106 may extend away from the fin 104, and pairs of conductive vias 120 may contact the pairs of the gates 106. The conductive vias 120 may extend through the hardmask 116 and the hardmask 118 to contact the gate metal 110 of the gates 106. The pairs of gates 108 may extend away from the fin 104, and pairs of conductive vias 122 may contact the pairs of the gates 108. The conductive vias 122 may extend through the hardmask 118 to contact the gate metal 112 of the gates 108. Conductive vias 136 may contact the interface material 141 and may thereby make electrical contact with the doped regions 140. The quantum dot device 100 may include further conductive vias and/or lines (not shown) to make electrical contact to the gates 106/108 and/or the doped regions 140, as desired.

During operation, a bias voltage may be applied to the doped regions 140 (e.g., via the conductive vias 136 and the interface material 141) to cause current to flow through the doped regions 140. When the doped regions 140 are doped with an n-type material, this voltage may be positive; when the doped regions 140 are doped with a p-type material, this voltage may be negative. The magnitude of this bias voltage may take any suitable value (e.g., between 0.25 volts and 2 volts).

The conductive vias 120, 122, and 136 may be electrically isolated from each other by an insulating material 130. The insulating material 130 may be any suitable material, such as an interlayer dielectric (ILD). Examples of the insulating material 130 may include silicon oxide, silicon nitride, aluminum oxide, and/or silicon oxynitride. As known in the art of integrated circuit manufacturing, conductive vias and lines may be formed in an iterative process in which layers of structures are formed on top of each other. In some embodiments, the conductive vias 120/122/136 may have a width that is 20 nanometers or greater at their widest point (e.g., 30 nanometers), and a pitch of 80 nanometers or greater (e.g., 100 nanometers). In some embodiments, conductive lines (not shown) included in the quantum dot device 100 may have a width that is 100 nanometers or greater, and a pitch of 100 nanometers or greater. The particular arrangement of conductive vias shown in FIGS. 1-4 is simply illustrative, and any electrical routing arrangement may be implemented.

As discussed above, the structure of the second gate of each pair of gates 106 may be the same as the structure of the first gate of each pair; similarly, the construction of the second gates of each pair of gates 106/108 on the fin 104 may be the same as the construction of the first gates of each pair of gates 106/108 on the fin. The first gates 106/108 on the fin 104 may be mirrored by corresponding second gates 106/108 on the same fin 104, and the insulating material 130 may separate the first gates of the pairs of gates 106/108 and the second gates of the pairs of gates 106/108. In particular, quantum dots 142-1 formed in the fin 104 as a result of applying voltages to the first gates of the pairs of gates 106/108 may have counterpart quantum dots 142-2 in the fin 104 formed, independently, as a result of applying voltages to the second gates of the pairs of gates 106/108 on the opposite side of the same fin 104. In some embodiments, the quantum dots 142-1 in the fin 104 formed in the vicinity of the first gates of the pairs of gates 106/108 may be used as "active" quantum dots in the sense that these quantum dots 142-1 act as qubits and are controlled (e.g., by voltages applied to the first gates 106/108 of the fin 104) to perform quantum competitions. The quantum dots 142-2 in the fin 104 formed in the vicinity of the second gates of the pairs of gates 106/108 may be used as "read" quantum dots in the sense that these quantum dots 142-2 may sense the quantum state of the quantum dots 142-1 in the fin 104 in the vicinity of the first gates by detecting the electric field generated by the charge in the quantum dots 142-1 in the fin 104, and may convert the quantum state of the quantum dots 142-1 in the fin 104 into electrical signals that may be detected by the second gates of the pairs of gates 106/108 on the fin 104. Each quantum dot 142-1 in the fin 104 may be read by its corresponding quantum dot 142-2 in the same fin 104. Thus, a single fin may be used to provide both active and read quantum dots. In other embodiments, a only active quantum dots may be provided in a single fin and read quantum dots may be provided in adjacent fin(s). In this manner, the quantum dot device 100 enables both quantum computation and the ability to read the results of a quantum computation.

The quantum dot devices 100 disclosed herein may be manufactured using any suitable techniques. FIGS. 5-11 illustrate various example stages in the manufacture of the quantum dot device 100 of FIGS. 1-4, in accordance with various embodiments. Although the particular manufacturing operations discussed below with reference to FIGS. 5-11 are illustrated as manufacturing a particular embodiment of the quantum dot device 100, these operations may be applied to manufacture many different embodiments of the quantum dot device 100, as discussed herein. Any of the elements discussed below with reference to FIGS. 5-11 may take the form of any of the embodiments of those elements discussed above (or otherwise disclosed herein).

Figure 5:
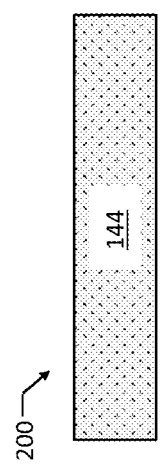

FIG. 5 illustrates a cross-sectional view of an assembly 200 including a semiconductor substrate 144. The semiconductor substrate 144 may include any semiconductor material or materials suitable for realizing quantum circuit components thereon. In one implementation, the substrate 144 may be a crystalline substrate such as, but not limited to a silicon or a sapphire substrate, and may be provided as a wafer or a portion thereof. In other implementations, the substrate may be non-crystalline. In general, any material that provides sufficient advantages (e.g. sufficiently good electrical isolation and/or ability to apply known fabrication and processing techniques) to outweigh the possible disadvantages (e.g. negative effects of spurious two-level systems), and that may serve as a foundation upon which a quantum circuit may be built, falls within the spirit and scope of the present disclosure. Additional examples of substrates to be used as the substrate 144 include silicon-on-insulator (SOI) substrates, III-V substrates, and quartz substrates.

Figure 6:
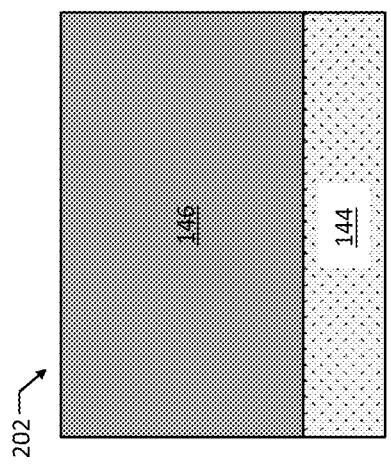
FIGS. 5-11 illustrate various example stages in the manufacture of a quantum dot device, in accordance with various embodiments.

FIG. 6 illustrates a cross-sectional view of an assembly 202 subsequent to providing a quantum well stack 146 on the semiconductor substrate 144 of the assembly 200 of FIG. 5. The quantum well stack 146 may include a quantum well layer (not shown) in which a 2DEG may form during operation of the quantum dot device 100. Various embodiments of the quantum well stack 146 are discussed below with reference to FIGS. 12-14.

Figure 7:
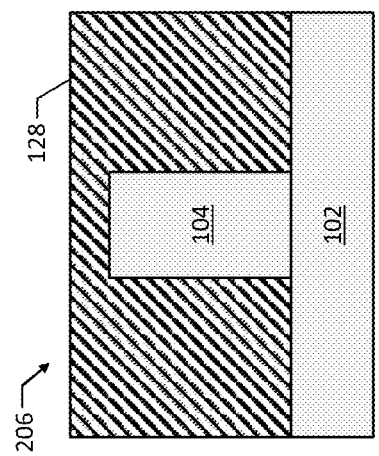

FIG. 7 illustrates a cross-sectional view of an assembly 204 subsequent to forming a fin 104 in the assembly 202 of FIG. 6. The fin 104 may extend from a base 102, and may be formed in the assembly 202 by patterning and then etching the assembly 202, as known in the art. For example, a combination of dry and wet etch chemistry may be used to form the fin 104, and the appropriate chemistry may depend on the materials included in the assembly 202, as known in the art. At least some of the semiconductor substrate 144 may be included in the base 102, and at least some of the quantum well stack 146 may be included in the fin 104. In particular, the quantum well layer (not shown) of the quantum well stack 146 may be included in the fin 104. Example arrangements in which the quantum well stack 146 and the semiconductor substrate 144 are differently included in the base 102 and the fin 104 are discussed below with reference to FIGS. 12-14.

Figure 8:
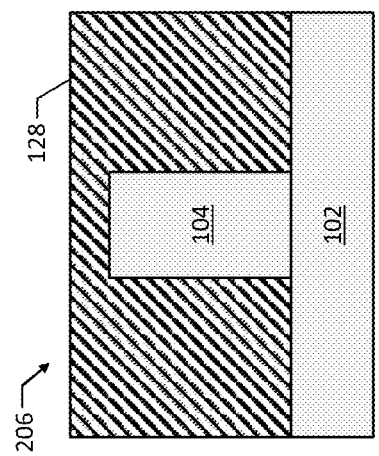

FIG. 8 illustrates a cross-sectional view of an assembly 206 subsequent to providing an insulating material 128 to the assembly 204 of FIG. 7. Any suitable material may be used as the insulating material 128 to electrically insulate the fin 104 from other fins (not shown). As noted above, in some embodiments, the insulating material 128 may be a dielectric material, such as silicon oxide.

Figure 9:
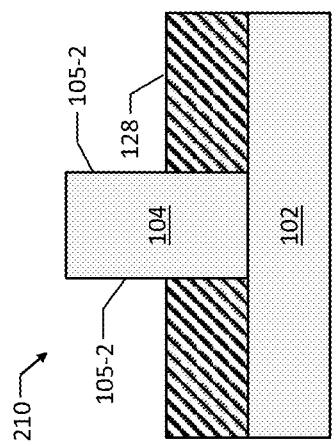

FIG. 9 illustrates a cross-sectional view of an assembly 208 subsequent to planarizing the assembly 206 of FIG. 8 to remove the insulating material 128 above the fin 104. In some embodiments, the assembly 206 may be planarized using a chemical mechanical polishing (CMP) technique.

Figure 10:
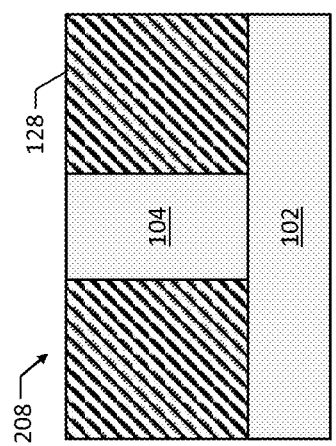

FIG. 10 illustrates a cross-sectional view of an assembly 210 subsequent to recessing the insulating material 128 of the assembly 208 of FIG. 9 to expose sides 105-1 and 105-2 of the fin 104. In some embodiments, the insulating material 128 may be recessed using a combination of dry and wet etch chemistry, as known in the art, where the appropriate chemistry may depend on the materials included in the assembly 208.

Figure 11:
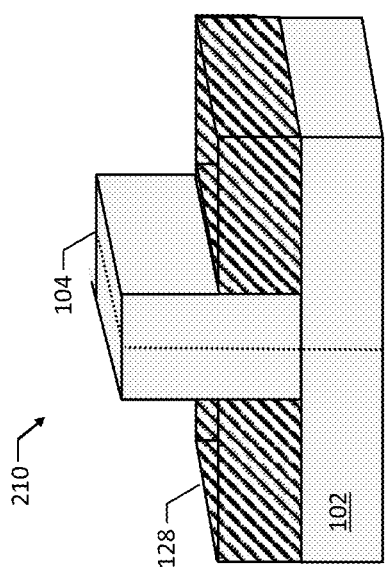

FIG. 11 is a perspective view of at least a portion of the assembly 210, showing the fin 104 extending from the base 102, with a lower portion of the fin 104 being covered by the insulating material 128 and an upper portion of the fin 104 being exposed (i.e. not covered by the insulating material 128). The cross-sectional views of FIGS. 5-10 are taken parallel to the plane of the page of the perspective view of FIG. 11.

Once the fin 104 with exposed sides 105-1 and 105-2 has been formed, techniques as known in the art may be used to provide one or more pairs of gates, with one gate of a pair being on one side of the fin and the other gate of a pair being on the opposite side of the fin, as well as to provide other elements described above with reference to FIGS. 1-4. Some of these known techniques may include e.g. providing gate dielectric materials; depositing gate metal materials e.g. using atomic layer deposition (ALD), physical vapor deposition (PVD) (e.g. evaporative deposition, magnetron sputtering, or e-beam deposition), chemical vapor deposition (CVD), or electroplating; forming hardmasks of an electrically insulating material, such as silicon nitride or carbon-doped nitride and patterning hardmasks, e.g. by applying a resist and then etching the hardmask (e.g. using dry etching or any appropriate technique); and removing gate metal that is not protected by the patterned hardmask(s) to form first and second gates of each pair. The techniques may further include providing spacer material (e.g. depositing nitride material (e.g., silicon nitride) using sputtering) and etching some of that material leaving spacers 134 formed of the spacer material on the sides of the each of the first and second gates 106 (e.g., on the sides of the hardmask 116 and the gate metal 110 of each gate). The etching of the spacer material may be an anisotropic etch, etching the spacer material "downward" to remove the spacer material on top of the gates 106 and in some of the area between the gates 106, while leaving the spacers 134 on the sides of the gates 106. In some embodiments, the anisotropic etch may be a dry etch. The techniques used in forming the quantum dot device 100 may further include providing the gate metal 112, which may fill the areas between adjacent ones of the gates 106, and may extend over the tops of the gates 106, and subsequently planarizing the assembly to remove the gate metal 112 above the gates 106, e.g. using a CMP technique. Still further, the techniques may include applying and patterning the hardmasks 118 and 117, similar to as described above with reference to the hardmask 116 and doping the fin 104 to form doped regions 140 in the portions of the fin 104 "outside" of the gates 106/108. The type of dopant used to form the doped regions 140 may depend on the type of quantum dot desired, as discussed above. In some embodiments, the doping may be performed by ion implantation. For example, when the quantum dots 142 are to be electron-type quantum dots 142, the doped regions 140 may be formed by ion implantation of phosphorous, arsenic, or another n-type material. An annealing process that activates the dopants and causes them to diffuse farther into the substrate fin 104 may follow the ion implantation process. The depth of the doped regions 140 may take any suitable value; for example, in some embodiments, the doped regions 140 may extend into the fin 104 to a depth 115 between 500 and 1000 Angstroms. The doping concentration of the doped regions 140 may, in some embodiments, be between 1017/cm3 and 1020/cm3. Still further, the techniques may include providing an insulating material 130 using any suitable technique, such as spin coating, chemical vapor deposition (CVD), or plasma-enhanced CVD (PECVD); and then forming conductive vias 120 through the insulating material 130 (and the hardmasks 116 and 118) to contact the gate metal 110 of the gates 106, forming conductive vias 122 through the insulating material 130 (and the hardmask 118) to contact the gate metal 112 of the gates 108, and forming conductive vias 136 through the insulating material 130 to contact the interface material 141 of the doped regions 140. Further conductive vias and/or lines may be formed using conventional interconnect techniques, if desired. The resulting assembly may take the form of the quantum dot device 100 discussed above with reference to FIGS. 1-4.

Figure 12:
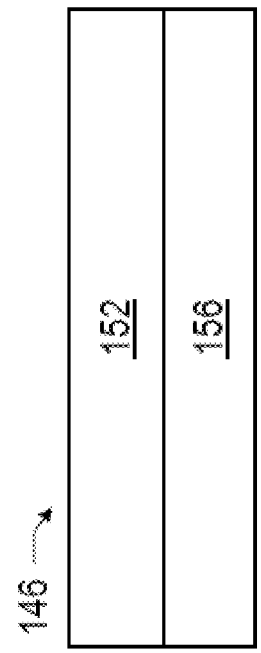
FIGS. 12-14 are cross-sectional views of various examples of quantum well stacks that may be used in a quantum dot device, in accordance with various embodiments.
Figure 13:
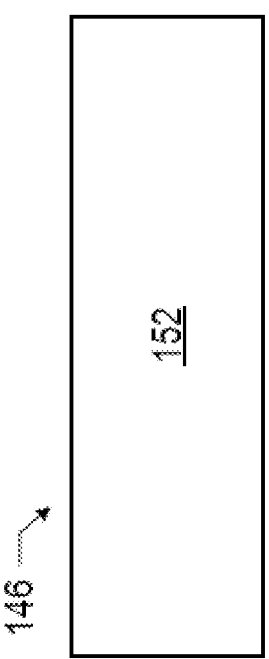
Figure 14:
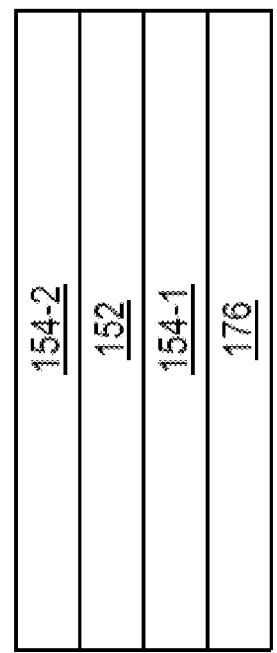

As discussed above, the base 102 and the fin 104 of a quantum dot device 100 may be formed from a semiconductor substrate 144 and a quantum well stack 146 disposed on the semiconductor substrate 144. The quantum well stack 146 may include a quantum well layer in which a 2DEG may form during operation of the quantum dot device 100. The quantum well stack 146 may take any of a number of forms, several of which are illustrated in FIGS. 12-14. The various layers in the quantum well stacks 146 discussed below may be grown on the semiconductor substrate 144 (e.g., using epitaxial processes).

FIG. 12 is a cross-sectional view of a quantum well stack 146 including only a quantum well layer 152. The quantum well layer 152 may be disposed on the semiconductor substrate 144 (e.g., as discussed above with reference to FIG. 5), and may be formed of a material such that, during operation of the quantum dot device 100, a 2DEG may form in the quantum well layer 152 proximate to the upper surface of the quantum well layer 152. The gate dielectric 114 of the gates 106/108 may be disposed on the upper surface of the quantum well layer 152 (e.g., as discussed above with reference to FIG. 11). In some embodiments, the quantum well layer 152 of FIG. 26 may be formed of intrinsic silicon, and the gate dielectric 114 may be formed of silicon oxide; in such an arrangement, during use of the quantum dot device 100, a 2DEG may form in the intrinsic silicon at the interface between the intrinsic silicon and the silicon oxide. In some such embodiments, the intrinsic silicon may be strained, while in other embodiments, the intrinsic silicon may not be strained. In other embodiments, the quantum well layer 152 of FIG. 12 may be formed of a suitable III-V compound, and the gate dielectric 114 may be formed of silicon oxide; in such an arrangement, during use of the quantum dot device 100, a 2DEG may form in the III-V compound at the interface between the III-V compound and the silicon oxide. In general, "III-V compounds" (also referred to as "III-V semiconductors") refer to chemical compounds with at least one element from group III of the periodic table and at least one element from group V, such as e.g. gallium arsenide (GaAs), indium antimonide (InSb), indium gallium arsenide (InGaAs), indium aluminium arsenide (InAlAs), aluminium indium antimonide (AlInSb), and aluminium gallium arsenide (AlGaAs). The thicknesses (i.e., z-heights) of the layers in the quantum well stack 146 of FIG. 12 may take any suitable values. For example, in some embodiments, the thickness of the quantum well layer 152 (e.g., intrinsic silicon, gallium arsenide, indium gallium arsenide, or indium antimonide) may be between 0.8 and 1.2 microns.

FIG. 13 is a cross-sectional view of a quantum well stack 146 including a quantum well layer 152 and a barrier layer 154. The quantum well stack 146 may be disposed on a semiconductor substrate 144 (e.g., as discussed above with reference to FIG. 6) such that the barrier layer 154 is disposed between the quantum well layer 152 and the semiconductor substrate 144. The barrier layer 154 may provide a potential barrier between the quantum well layer 152 and the semiconductor substrate 144. As discussed above with reference to FIG. 12, the quantum well layer 152 of FIG. 27 may be formed of a material such that, during operation of the quantum dot device 100, a 2DEG may form in the quantum well layer 152 proximate to the upper surface of the quantum well layer 152. For example, in some embodiments in which the semiconductor substrate 144 is formed of silicon, the quantum well layer 152 of FIG. 13 may be formed of silicon, and the barrier layer 154 may be formed of silicon germanium. The germanium content of this silicon germanium may be 20-80% (e.g., 30%). In other embodiments, the quantum well layer 152 of FIG. 13 may be formed of gallium arsenide (GaAs), and the barrier layer 154 may be formed of aluminium gallium arsenide (AlGaAs). In another example, the quantum well layer 152 of FIG. 13 may be formed of indium gallium arsenide (InGaAs), and the barrier layer 154 may be formed of indium aluminium arsenide (InAlAs). The indium content of this indium gallium arsenide and indium gallium arsenide described herein with reference to other embodiments, may be 20-80% (e.g., 50%). In yet another example, the quantum well layer 152 of FIG. 13 may be formed of indium antimonide (InSb), and the barrier layer 154 may be formed of aluminium indium antimonide (AlInSb). In other embodiments, other combinations of III-V compounds may be used for forming the quantum well layer 152 and the barrier layer 154, as long as a III-V compound of the quantum well layer 152 is a semiconductor having a smaller bandgap than a III-V compound of the barrier layer 154, in order to achieve quantum confinement in the quantum well layer. The thicknesses (i.e., z-heights) of the layers in the quantum well stack 146 of FIG. 13 may take any suitable values. For example, in some embodiments, the thickness of the barrier layer 154 may be between 0 and 400 nanometers. In some embodiments, the thickness of the quantum well layer 152 may be between 5 and 30 nanometers.

FIG. 14 is a cross-sectional view of a quantum well stack 146 including a quantum well layer 152 and a barrier layer 154-1, as well as a buffer layer 176 and an additional barrier layer 154-2. Each of these layers may be formed of a III-V material. The quantum well stack 146 may be disposed on the semiconductor substrate 144 (e.g., as discussed above with reference to FIG. 6) such that the buffer layer 176 is disposed between the barrier layer 154-1 and the semiconductor substrate 144. The buffer layer 176 may be present to trap defects that form in this material as it is grown on the semiconductor substrate 144. The buffer layer 176 may be formed of the same or different material as the barrier layer 154. In some embodiments, the buffer layer 176 may be grown under different conditions (e.g., deposition temperature or growth rate) from the barrier layer 154-1. In particular, the barrier layer 154-1 may be grown under conditions that achieve fewer defects than the buffer layer 176. In some embodiments in which the buffer layer 176 includes silicon germanium, the silicon germanium of the buffer layer 176 may have a germanium content that varies from the semiconductor substrate 144 to the barrier layer 154-1; for example, the silicon germanium of the buffer layer 176 may have a germanium content that varies from zero percent at the silicon semiconductor substrate 144 to a nonzero percent (e.g., 30%) at the barrier layer 154-1. In some embodiments, the buffer layer 176 may be formed of gallium arsenide while the barrier layer 154-1 may be formed of aluminium indium antimonide, aluminium gallium arsenide, indium gallium arsenide, or indium aluminium arsenide. The thicknesses (i.e., z-heights) of the layers in the quantum well stack 146 of FIG. 14 may take any suitable values. For example, in some embodiments, the thickness of the buffer layer 176 may be between 0.3 and 4 microns (e.g., 0.3-2 microns, or 0.5 microns). In some embodiments, the thickness of the barrier layer 154-1 may be between 0 and 400 nanometers. In some embodiments, the thickness of the quantum well layer 152 may be between 5 and 30 nanometers (e.g., 10 nanometers). In some embodiments, the thickness of the barrier layer 154-2 may be between 25 and 75 nanometers (e.g., 32 nanometers).

As discussed above with reference to FIG. 13, the quantum well layer 152 of FIG. 14 may be formed of a material such that, during operation of the quantum dot device 100, a 2DEG may form in the quantum well layer 152 proximate to the upper surface of the quantum well layer 152. For example, in some embodiments in which the semiconductor substrate 144 is formed of silicon, the quantum well layer 152 of FIG. 14 may be formed of silicon, and the barrier layer 154-1 and the buffer layer 176 may be formed of silicon germanium. In some such embodiments, the silicon germanium of the buffer layer 176 may have a germanium content that varies from the semiconductor substrate 144 to the barrier layer 154-1; for example, the silicon germanium of the buffer layer 176 may have a germanium content that varies from zero percent at the silicon semiconductor substrate 144 to a nonzero percent (e.g., 30%) at the barrier layer 154-1. The barrier layer 154-1 may in turn have a germanium content equal to the nonzero percent. In other embodiments, the buffer layer 176 may have a germanium content equal to the germanium content of the barrier layer 154-1, but may be thicker than the barrier layer 154-1 so as to absorb the defects that arise during growth. In another example, in some embodiments in which the semiconductor substrate 144 is formed of silicon, the quantum well layer 152 of FIG. 14 may be formed of gallium arsenide (GaAs), the barrier layer 154-1 may be formed of aluminium gallium arsenide (AlGaAs), and the buffer layer 176 may be formed of indium gallium arsenide (InGaAs). In another example, both the quantum well layer 152 and the barrier layer 154-1 of FIG. 14 may be formed of indium gallium arsenide (InGaAs) but with varying ratios between indium content and gallium content (e.g. 70% indium content in the indium gallium arsenide in the quantum well layer 152 and 50% indium content in the indium gallium arsenide in the barrier layer 154-1), and the buffer layer 176 may be formed of indium aluminium arsenide (InAlAs). In such example, the buffer layer 176 may additionally include a layer of gallium arsenide (GaAs) disposed between a layer of indium aluminium arsenide and the substrate 144. In yet another example, the quantum well layer 152 of FIG. 14 may be formed of indium antimonide (InSb), the barrier layer 154-1 may be formed of aluminium indium antimonide (AlInSb), and the buffer layer 176 may be formed of gallium arsenide (GaAs).

The barrier layer 154-2, like the barrier layer 154-1, may provide a potential energy barrier around the quantum well layer 152, and may take the form of any of the embodiments of the barrier layer 154-1. In various embodiments, any suitable combinations of III-V or silicon/silicon germanium compounds may be used for forming the quantum well layer 152, the barrier layer 154-1, the barrier layer 154-2, and the buffer layer 176, as long as the material of the quantum well layer 152 is a semiconductor having a smaller bandgap than the material of layers that sandwich the quantum well layer 152, in order to achieve quantum confinement in the quantum well layer. In some embodiments of the quantum well stack 146 of FIG. 28, the buffer layer 176 and/or the barrier layer 154-2 may be omitted.

The semiconductor substrate 144 and the quantum well stack 146 may be distributed between the base 102 and the fin 104 of the quantum dot device 100, as discussed above. This distribution may occur in any of a number of ways. For example, FIGS. 15-21 illustrate example base/fin arrangements 158 that may be used in a quantum dot device 100, in accordance with various embodiments.

Figure 15:
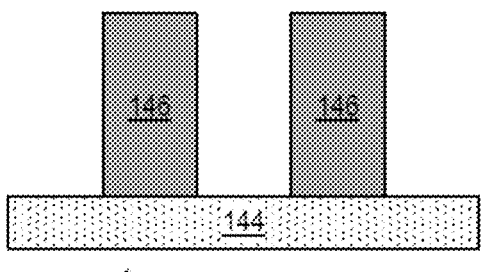
FIGS. 15-21 illustrate example base/fin arrangements that may be used in a quantum dot device, in accordance with various embodiments.

In the base/fin arrangement 158 of FIG. 15, the quantum well stack 146 may be included in the fin 104, but not in the base 102. The semiconductor substrate 144 may be included in the base 102, but not in the fin 104. When the base/fin arrangement 158 of FIG. 15 is used in the manufacturing operations discussed with reference to FIGS. 6-7, the fin etching may etch through the quantum well stack 146, and stop when the semiconductor substrate 144 is reached.

Figure 16:
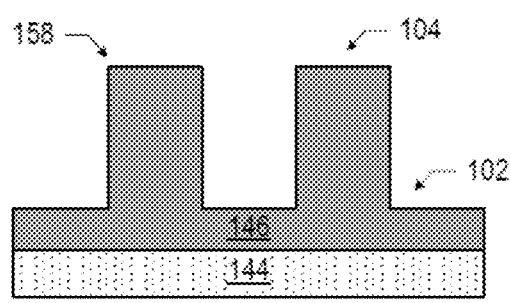
Figure 17:
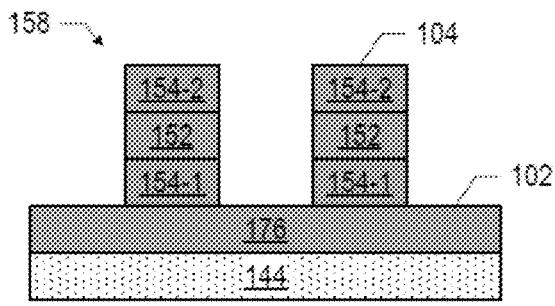

In the base/fin arrangement 158 of FIG. 16, the quantum well stack 146 may be included in the fin 104, as well as in a portion of the base 102. A semiconductor substrate 144 may be included in the base 102 as well, but not in the fin 104. When the base/fin arrangement 158 of FIG. 16 is used in the manufacturing operations discussed with reference to FIGS. 6-7, the fin etching may etch partially through the quantum well stack 146, and stop before the semiconductor substrate 144 is reached. FIG. 17 illustrates a particular embodiment of the base/fin arrangement 158 of FIG. 16. In the embodiment of FIG. 17, the quantum well stack 146 of FIG. 14 is used; the fin 104 include the barrier layer 154-1, the quantum well layer 152, and the barrier layer 154-2, while the base 102 includes the buffer layer 176 and the semiconductor substrate 144.

Figure 18:
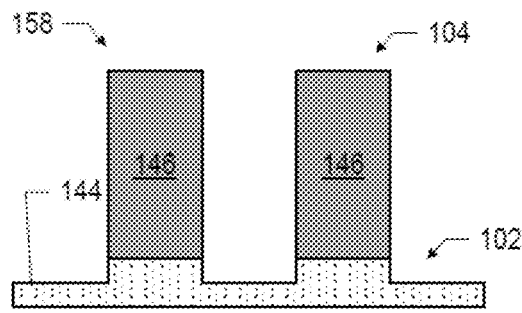
Figure 19:
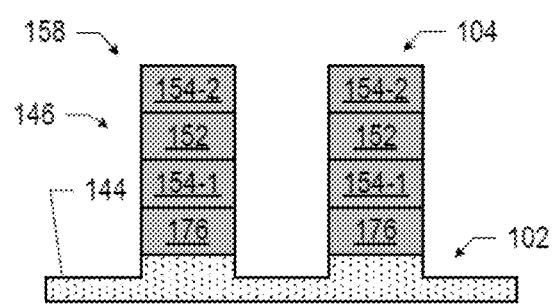

In the base/fin arrangement 158 of FIG. 18, the quantum well stack 146 may be included in the fin 104, but not the base 102. The semiconductor substrate 144 may be partially included in the fin 104, as well as in the base 102. When the base/fin arrangement 158 of FIG. 18 is used in the manufacturing operations discussed with reference to FIGS. 6-7, the fin etching may etch through the quantum well stack 146 and into the semiconductor substrate 144 before stopping. FIG. 19 illustrates a particular embodiment of the base/fin arrangement 158 of FIG. 18. In the embodiment of FIG. 19, the quantum well stack 146 of FIG. 14 is used; the fin 104 include the quantum well stack 146 and a portion of the semiconductor substrate 144, while the base 102 includes the remainder of the semiconductor substrate 144.

Figure 20:
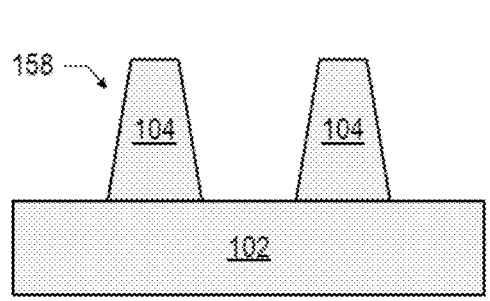
Figure 21:
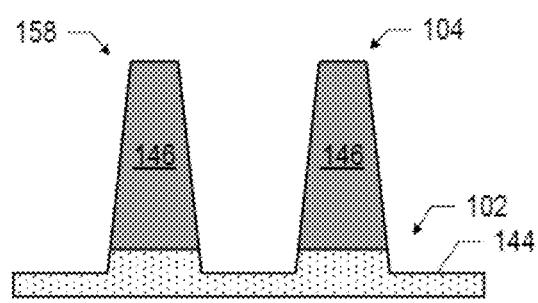

Although the fin 104 have been illustrated in many of the preceding figures as substantially rectangular with parallel sidewalls, this is simply for ease of illustration, and the fin 104 may have any suitable shape (e.g., shape appropriate to the manufacturing processes used to form the fin 104). For example, in some embodiments, the fin 104 may be tapered. In some embodiments, the fin 104 may taper by 3-10 nanometers in x-width for every 100 nanometers in z-height (e.g., 5 nanometers in x-width for every 100 nanometers in z-height). When the fin 104 are tapered, the wider end of the fin 104 may be the end closest to the base 102, as illustrated in FIG. 20. FIG. 21 illustrates a particular embodiment of the base/fin arrangement 158 of FIG. 20. In FIG. 21, the quantum well stack 146 is included in the tapered fin 104 while a portion of the semiconductor substrate 144 is included in the tapered fins and a portion of the semiconductor substrate 144 provides the base 102.

FIG. 36 illustrates an assembly 242 subsequent to providing the gate metal 112 and a hardmask 118 on the assembly 218 (FIG. 15). The assembly 242 may be similar to the assembly 224 of FIG. 18 (and may be formed using any of the techniques discussed above with reference to FIGS. 16-18), but may include additional gate metal 112 between the hardmask 116 and the hardmask 118, of any desired thickness. In some embodiments, the gate metal 112 may be planarized prior to provision of the hardmask 118, but the hardmask 118 may still be spaced away from the hardmask 116 in the z-direction by the gate metal 112, as shown in FIG. 36.

Figure 22:
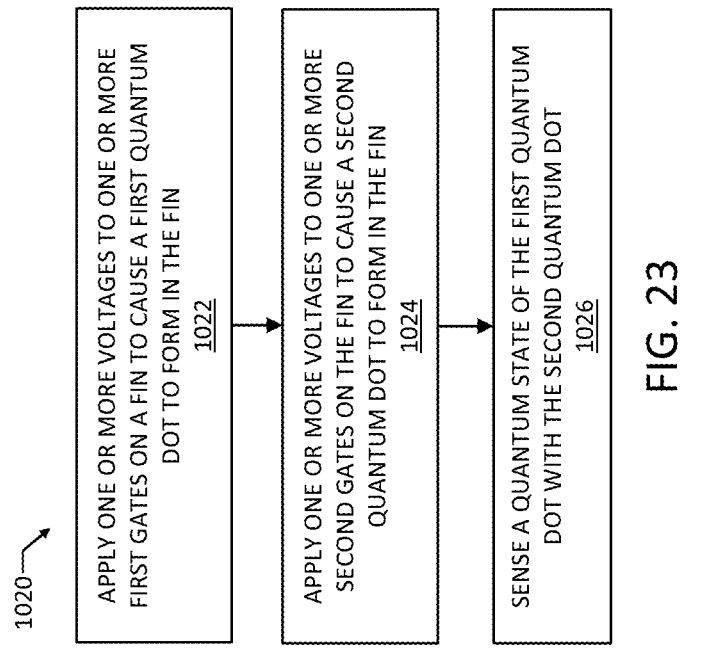
FIG. 22 is a flow diagram of an illustrative method of manufacturing a quantum dot device, in accordance with various embodiments.

As noted above, any suitable techniques may be used to manufacture the quantum dot devices 100 disclosed herein. FIG. 22 is a flow diagram of an illustrative method 1000 of manufacturing a quantum dot device, in accordance with various embodiments. Although the operations discussed below with reference to the method 1000 are illustrated in a particular order and depicted once each, these operations may be repeated or performed in a different order (e.g., in parallel), as suitable. Additionally, various operations may be omitted, as suitable. Various operations of the method 1000 may be illustrated with reference to one or more of the embodiments discussed above, but the method 1000 may be used to manufacture any suitable quantum dot device (including any suitable ones of the embodiments disclosed herein).

At 1002, a quantum well stack may be provided on a semiconductor substrate. The quantum well stack may include a quantum well layer. For example, a quantum well stack 146 including a quantum well layer 152 may be provided on a semiconductor substrate 144 (e.g., as discussed above with reference to FIGS. 5-6 and 12-14).

At 1004, at least some of the quantum well stack may be removed to form fins that include the quantum well layer. For example, at least some of the quantum well stack 146 may be removed to form the fin 104 that include the quantum well layer 152 (e.g. as discussed above with reference to FIGS. 7 and 15-21).

At 1006, an insulating material may be provided between the fins. For example, the insulating material 128 may be provided around the fin 104 (e.g., as discussed above with reference to FIG. 8).

At 1008, the insulating material 128 may be recessed to expose portions of the sides 105 of the fin 104 (e.g., as discussed above with reference to FIGS. 9 and 10).

At 1010, one or more pairs of gates, each pair including a first and a second gate, may be formed on the exposed portions of the sides of the fin 104. For example, multiple pairs of gates 106 may be formed on the fin 104 (e.g., as discussed above with reference to FIGS. 1-4).

At 1012, spacers may be provided on the first and the second sides of the fin, e.g. as discussed above with reference to FIGS. 1-4.

Figure 23:
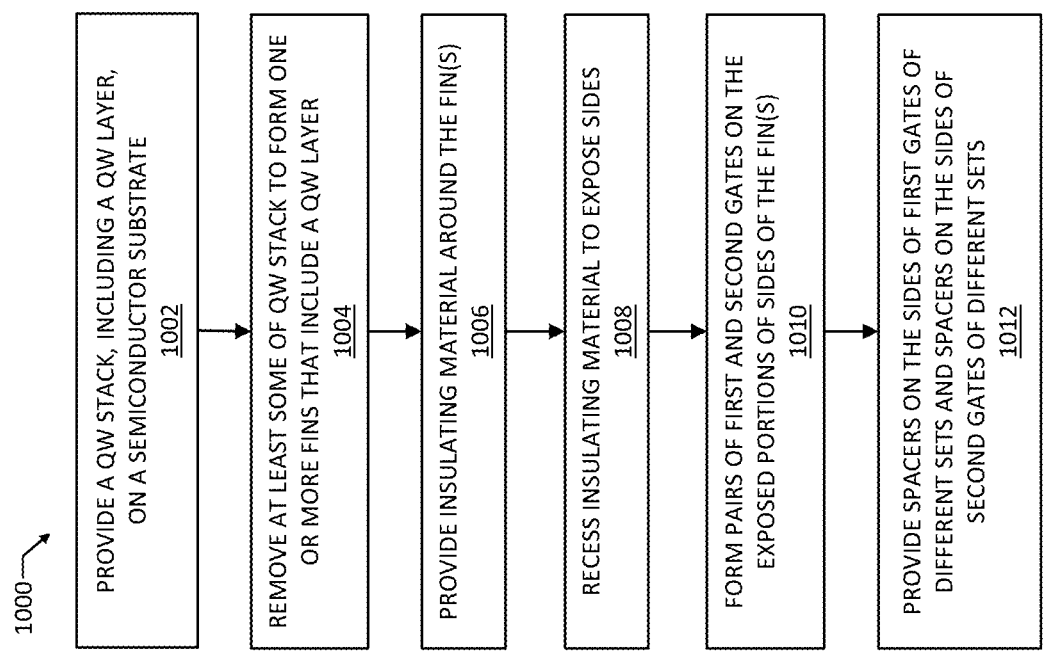
FIG. 23 is a flow diagram of an illustrative method of operating a quantum dot device, in accordance with various embodiments.

FIG. 23 is a flow diagram of a particular illustrative method 1020 of operating a quantum dot device, in accordance with various embodiments. Although the operations discussed below with reference to the method 1020 are illustrated in a particular order and depicted once each, these operations may be repeated or performed in a different order (e.g., in parallel), as suitable. Additionally, various operations may be omitted, as suitable. Various operations of the method 1020 may be illustrated with reference to one or more of the embodiments discussed above, but the method 1020 may be used to operate any suitable quantum dot device (including any suitable ones of the embodiments disclosed herein).

Turning to the method 1020 of FIG. 23, at 1022, one or more voltages may be applied to one or more first gates provided on a first side of a fin to cause a first quantum dot to form in the fin. The fin may extend away from a base. For example, one or more voltages may be applied to the first gates of the pairs of gates 106/108 on the first side 105-1 of the fin 104 (extending away from the base 102) to cause at least one quantum dot 142-1 to form in the fin 104.

At 1024, one or more voltages may be applied to one or more second gates provided on a second side of a fin to cause a second quantum dot to form in the fin. For example, one or more voltages may be applied to second gates of the pairs of gates 106/108 on the second side 105-2 of the fin 104 to cause at least one additional quantum dot 142-2 to form in the fin 104.

At 1026, a quantum state of the first quantum dot may be sensed with the second quantum dot. For example, a quantum dot 142-2 closest to the second side 105-2 of the fin 104 (the "read" portion of the fin 104) may sense the quantum state of a quantum dot 142-1 closest to the first side 105-1 of the fin 104 (the "active" portion of the fin 104).

Exemplary Quantum Computing Device

In various embodiments, quantum dot devices as described herein may be used to implement components associated with a quantum integrated circuit (IC). Such components may include those that are mounted on or embedded in a quantum IC, or those connected to a quantum IC. The quantum IC may be either analog or digital and may be used in a number of applications within or associated with quantum systems, such as e.g. quantum processors, quantum amplifiers, quantum sensors, etc., depending on the components associated with the integrated circuit. The integrated circuit may be employed as part of a chipset for executing one or more related functions in a quantum system.

Figure 24:
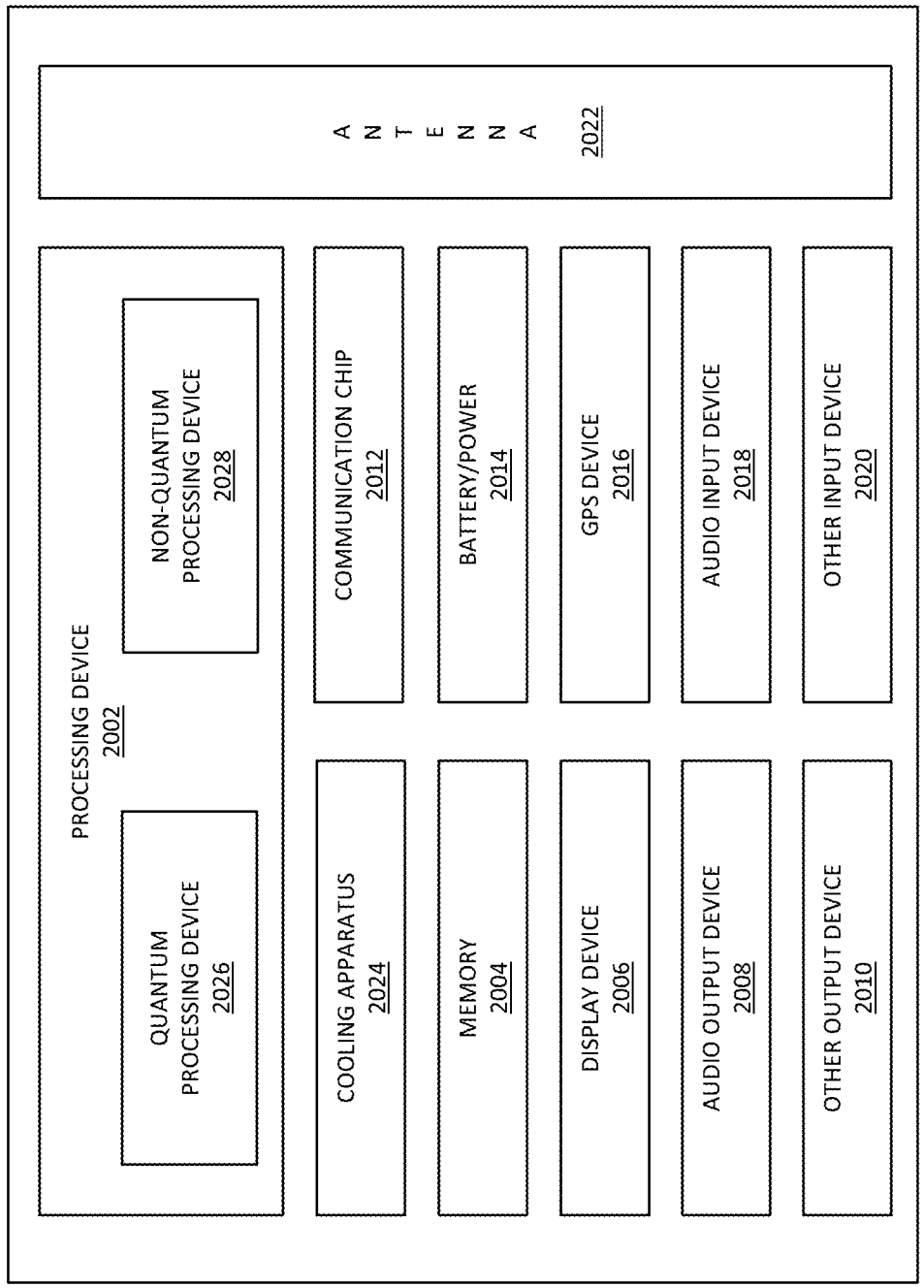
FIG. 24 is a block diagram of an example quantum computing device that may include any of the quantum dot devices disclosed herein, in accordance with various embodiments.

FIG. 24 is a block diagram of an example quantum computing device 2000 that may include any of the quantum dot devices disclosed herein. A number of components are illustrated in FIG. 24 as included in the quantum computing device 2000, but any one or more of these components may be omitted or duplicated, as suitable for the application. In some embodiments, some or all of the components included in the quantum computing device 2000 may be attached to one or more printed circuit boards (e.g., a motherboard). In some embodiments, various ones of these components may be fabricated onto a single system-on-a-chip (SoC) die. Additionally, in various embodiments, the quantum computing device 2000 may not include one or more of the components illustrated in FIG. 24, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2024 or an audio output device 2008, but may include audio input or output device interface circuitry (e.g., connectors and supporting circuitry) to which an audio input device 2024 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of the quantum dot devices 100 disclosed herein, and may perform data processing by performing operations on the quantum dots that may be generated in the quantum dot devices 100, and monitoring the result of those operations. For example, as discussed above, different quantum dots may be allowed to interact, the quantum states of different quantum dots may be set or transformed, and the quantum states of quantum dots may be read (e.g., by another quantum dot). The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random-access memory (STT-MRAM).

The quantum computing device 2000 may include a cooling apparatus 2030. The cooling apparatus 2030 may maintain the quantum processing device 2026 at a predetermined low temperature during operation to reduce the effects of scattering in the quantum processing device 2026. This predetermined low temperature may vary depending on the setting; in some embodiments, the temperature may be 5 degrees Kelvin or less. In some embodiments, the non-quantum processing device 2028 (and various other components of the quantum computing device 2000) may not be cooled by the cooling apparatus 2030, and may instead operate at room temperature. The cooling apparatus 2030 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as GPS, EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The quantum computing device 2000 may include a global positioning system (GPS) device 2018 (or corresponding interface circuitry, as discussed above). The GPS device 2018 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Selected Examples

Some Examples in accordance with various embodiments of the present disclosure are now described.

Example 1 provides a quantum dot device including a base; a fin extending away from the base, where the fin includes a quantum well layer; a first gate disposed on a first side of the fin; and a second gate disposed on a second side of the fin.

Example 2 provides the quantum dot device according to Example 1, where the first gate is opposite to the second gate.

Example 3 provides the quantum dot device according to Example 1, where the first side and the second side of the fin are extending away from the base.

Example 4 provides the quantum dot device according to Example 1, where the first gate is disposed on a first portion of the first side of the fin and the second gate is disposed on a first portion of the second side of the fin, and an insulating material is disposed on a second portion of the first side of the fin and on a second portion of the second side of the fin.

Example 5 provides the quantum dot device according to Example 1, where the first gate and the second gate are the first gate and the second gate of a first set of gates, and the quantum dot device further includes a first gate of a second set of gates, disposed on the first side of the fin; a second gate of the second set of gates, disposed on the second side of the fin.

Example 6 provides the quantum dot device according to Example 5, where the first gate of the first set of gates and the first gate of the second set of gates are spaced apart by a distance between 40 and 60 nanometers.

Example 7 provides the quantum dot device according to any one of Examples 1-6, where the first side and the second side of the fin are spaced apart by a distance between 10 and 30 nanometers (i.e. the width of the fin is between 10 and 30 nanometers).

Example 8 provides the quantum dot device according to any one of Examples 1-6, where each of the first gate and the second gate has a height between 20 and 40 nanometers along a direction of the fin extending away from the base.

Example 9 provides the quantum dot device according to any one of Examples 1-6, where the fin has a height between 250 and 350 nanometers.

Example 10 provides the quantum dot device according to any one of Examples 1-6, where the fin has a tapered shape that is widest proximate to the base.

Example 11 provides the quantum dot device according to any one of Examples 1-6, where the base includes a semiconductor substrate, and the semiconductor substrate extends into the fin.

Example 12 provides the quantum dot device according to any one of Examples 1-6, where the base includes a semiconductor substrate, and where a barrier layer is disposed between the semiconductor substrate and the quantum well layer.

Example 13 provides the quantum dot device according to any one of Examples 1-6, where the quantum well layer is included in a silicon/silicon germanium material stack.

Example 14 provides the quantum dot device according to any one of Examples 1-6, where the quantum well layer is included in a material stack including two or more III-V compounds.

Example 15 provides the quantum dot device according to Example 14, where the two or more III-V compounds include two or more of gallium arsenide (GaAs), indium antimonide (InSb), indium gallium arsenide (InGaAs), indium aluminium arsenide (InAlAs), aluminium indium antimonide (AlInSb), and aluminium gallium arsenide (AlGaAs).

Example 16 provides a method of operating a quantum dot device, the method including applying one or more voltages to one or more first gates on a fin extending away from a base to cause a first quantum dot to form in the fin; applying one or more voltages to one or more second gates on the fin to cause a second quantum dot to form in the fin; and sensing a quantum state of the first quantum dot with the second quantum dot.

Example 17 provides the method according to Example 16, where the one or more first gates are provided on a first side of the fin and the one or more second gates are provided on a second side of the fin.

Example 18 provides the method according to Example 16, where the first side of the fin is opposite to the second side of the fin.

Example 19 provides the method according to Example 16, where applying the one or more voltages to the one or more first gates on the fin includes applying a voltage to a first gate of the one or more first gates to cause the first quantum dot to form in a portion of the fin adjacent to the first gate of the one or more first gates. Similarly, applying the one or more voltages to the one or more second gates on the fin includes applying a voltage to a first gate of the one or more second gates to cause the second quantum dot to form in a portion of the fin adjacent to the first gate of the one or more second gates.

Example 20 provides the method according to any one of Examples 16-19, further including applying the one or more voltages to the one or more first gates on the fin to cause a third quantum dot to form in the fin; and prior to sensing the quantum state of the first quantum dot with the second quantum dot, allowing the first and third quantum dots to interact.

Example 21 provides the method according to Example 20, where allowing the first and third quantum dots to interact includes applying the one or more voltages to the one or more first gates to control interaction between the first and third quantum dots.

Example 22 provides a method of manufacturing a quantum dot device, including providing a quantum well stack on a semiconductor substrate, where the quantum well stack includes a quantum well layer; removing at least some of the quantum well stack to form one or more fins, where the one or more fins include the quantum well layer; providing one or more first gates on a first side of each of the one or more fins; and providing one or more second gates on a second side of the each of the one or more fins.

Example 23 provides the method according to Example 22, where, for the each of the one or more fins, the first side is opposite to the second side.

Example 24 provides a quantum computing device including a quantum processing device, a non-quantum processing device, and a memory device. The quantum processing device includes a fin extending away from a base, an active portion of a quantum well layer in the fin, and a read portion of the quantum well layer in the fin. The non-quantum processing device is coupled to the quantum processing device and configured to control voltages applied to one or more first gates on a first side of the fin and to control voltages applied to one or more second gates on a second side of the fin. The memory device is configured to store data generated by the read portion of the quantum well layer during operation of the quantum processing device.

In a further Example of the quantum computing device according to Example 24, the first side of the fin is closer to the active portion of the quantum well layer than the second side, and the second side of the fin is closer to the read portion of the quantum well layer than the first side.

Example 25 provides the quantum computing device according to Example 24, further including a cooling apparatus configured to maintain a temperature of the quantum processing device below 5 degrees Kelvin.

In a further Example of the quantum computing device according to any one of Examples 24-25, the memory device is configured to store instructions for a quantum computing algorithm to be executed by the quantum processing device.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The invention claimed is:

1. A quantum dot device comprising:
a base;
a fin extending away from the base, wherein the fin comprises a quantum well layer;
a first gate, comprising a first gate electrode material over a first sidewall of the fin;
a second gate, comprising a second gate electrode material over a second sidewall of the fin; and
an insulating material that separates the first gate electrode material and the second gate electrode material above a top of the fin,
wherein the first gate electrode material and the second gate electrode material are the first gate electrode material and the second gate electrode material of a first set of gates, and the quantum dot device further includes:
a first gate electrode material of a second set of gates, over the first sidewall of the fin, and
a second gate electrode material of the second set of gates, over the second sidewall of the fin.

2. The quantum dot device according to claim 1, wherein the first gate electrode material is opposite to the second gate electrode material.

3. The quantum dot device according to claim 1, wherein the first sidewall and the second sidewall of the fin extend away from the base.

4. The quantum dot device according to claim 1, wherein:
the first gate electrode material is over a first portion of the first sidewall of the fin
the second gate electrode material is over a first portion of the second sidewall of the fin, and
a further insulating material is over a second portion of the first sidewall of the fin and on a second portion of the second sidewall of the fin.

5. The quantum dot device according to claim 1, wherein a distance between the first gate electrode material of the first set of gates and the first gate electrode material of the second set of gates is between 40 and 60 nanometers.

6. The quantum dot device according to claim 1, wherein a distance between the first sidewall and the second sidewall of the fin is between 10 and 30 nanometers.

7. The quantum dot device according to claim 1, wherein each of the first gate electrode material and the second gate electrode material has a height between 20 and 40 nanometers along a direction of the fin extending away from the base.

8. The quantum dot device according to claim 1, wherein the fin has a height between 250 and 350 nanometers.

9. The quantum dot device according to claim 1, wherein the fin has a tapered shape that is widest proximate to the base.

10. The quantum dot device according to claim 1, wherein the base includes a semiconductor material, and wherein a barrier layer is disposed between the semiconductor material and the quantum well layer.

11. The quantum dot device according to claim 1, further comprising a material stack that includes one or more of silicon and germanium, wherein the quantum well layer is a part of the material stack.

12. The quantum dot device according to claim 1, further comprising a material stack that includes two or more III-V compounds, wherein the quantum well layer is a part of the material stack.

13. The quantum dot device according to claim 1, wherein the insulating material is arranged so that no portion of the first gate electrode material of the first gate is in contact with any portion of the second gate electrode material of the second gate above the top of the fin.

14. The quantum dot device according to claim 1, wherein the first gate electrode material of the first set of gates and the first gate electrode material of the second set of gates are electrically isolated from one another.

* * * * *